US011532369B2

(12) United States Patent
Choi et al.

(10) Patent No.: US 11,532,369 B2
(45) Date of Patent: Dec. 20, 2022

(54) MEMORY DEVICE AND METHOD OF OPERATING THE SAME

(71) Applicant: SK hynix Inc., Icheon-si (KR)

(72) Inventors: Hyung Jin Choi, Icheon-si (KR); Hee Joo Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 17 days.

(21) Appl. No.: 17/217,374

(22) Filed: Mar. 30, 2021

(65) Prior Publication Data

US 2022/0101933 A1 Mar. 31, 2022

(30) Foreign Application Priority Data

Sep. 29, 2020 (KR) .................. 10-2020-0126702

(51) Int. Cl.
| | | |
|---|---|---|
| *G11C 11/34* | (2006.01) | |
| *G11C 16/34* | (2006.01) | |
| *G11C 16/10* | (2006.01) | |
| *G11C 16/04* | (2006.01) | |
| *G11C 16/30* | (2006.01) | |
| *G11C 16/32* | (2006.01) | |
| *G11C 16/26* | (2006.01) | |

(52) U.S. Cl.
CPC ...... *G11C 16/3459* (2013.01); *G11C 16/0483* (2013.01); *G11C 16/10* (2013.01); *G11C 16/26* (2013.01); *G11C 16/30* (2013.01); *G11C 16/32* (2013.01); *G11C 16/3404* (2013.01)

(58) Field of Classification Search
CPC . G11C 16/3459; G11C 16/0483; G11C 16/10; G11C 16/26; G11C 16/30; G11C 16/32; G11C 16/3404; G11C 11/5628; G11C 16/08

USPC ..................................................... 365/185.22
See application file for complete search history.

(56) References Cited

U.S. PATENT DOCUMENTS

| 9,711,197 | B1* | 7/2017 | Kim ....................... G11C 7/12 |
| 11,094,386 | B1* | 8/2021 | Yang ..................... G11C 16/30 |
| 2018/0122489 | A1* | 5/2018 | Ray ........................ G11C 16/28 |

(Continued)

FOREIGN PATENT DOCUMENTS

| KR | 1020130072668 A | 7/2013 |
| KR | 1020190128794 A | 11/2019 |

*Primary Examiner* — Huan Hoang
*Assistant Examiner* — Minh Dinh
(74) *Attorney, Agent, or Firm* — William Park & Associates Ltd.

(57) ABSTRACT

A memory device and a method of operating the same are provided. The memory device may include a peripheral circuit configured to perform a plurality of program loops and program a page selected from among the plurality of pages, wherein the peripheral circuit may count a number of memory cells whose threshold voltages have increased up to a first target voltage, among a part of memory cells included in the selected page, and may perform a current sensing check operation of determining whether a verify operation performed in a previous program loop has passed or failed, and a control logic circuit configured to control the peripheral circuit so that the current sensing check operation is performed when the number of memory cells whose threshold voltages have increased up to the first target voltage, is equal to or greater than a reference number of memory cells.

22 Claims, 24 Drawing Sheets

(56) References Cited

U.S. PATENT DOCUMENTS

2018/0350441 A1* 12/2018 Kim .................... G06F 11/1012
2020/0051649 A1* 2/2020 Her ........................ G11C 16/30

* cited by examiner

MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0126702 filed on Sep. 29, 2020, in the Korean intellectual Property Office, the entire disclosure of which is incorporated by reference herein.

BACKGROUND

1. Technical Field

Various embodiments of the present disclosure relate to a memory device and a method of operating the memory device, and more particularly to a memory device that is capable of performing a program operation and a method of operating the memory device.

2. Related Art

Memory devices may include a volatile memory device in which stored data is lost when the supply of power is interrupted and a nonvolatile memory device in which stored data is retained even when the supply of power is interrupted.

Examples of the volatile memory device may include a dynamic random-access memory (DRAM) and a static random-access memory (SRAM). Examples of the nonvolatile memory device may include a read only memory (ROM), a programmable read only memory (PROM), an erasable PROM (EPROM), an electrically EPROM (EEPROM), a NAND flash, etc.

A memory device may include a memory cell array, peripheral circuits, and a control logic circuit.

The memory cell array may include a plurality of memory cells, each of which may store data. A scheme for storing one bit of data in one memory cell is referred to as a single-level cell (SLC) scheme, and a scheme for storing two or more bits of data in one memory cell is referred to as a multi-level cell (MLC) scheme. The MLC scheme may be classified into a triple-level cell (TLC) scheme and a quadruple-level cell (QLC) depending on the number of bits stored in each memory cell. In the TLC scheme, three bits of data may be stored in one memory cell, and in the QLC scheme, four bits of data may be stored in one memory cell.

SUMMARY

Various embodiments of the present disclosure are directed to a memory device which can shorten an operating time by performing a current sensing check operation since the number of memory cells having passed a verify operation, among memory cells having the lowest target voltage, has reached the reference number of memory cells during a program operation performed on a selected page, and a method of operating the memory device.

An embodiment of the present disclosure may provide a memory device. The memory device may include a plurality of pages, each including a plurality of memory cells, a peripheral circuit, and a control logic circuit. The peripheral circuit is configured to perform a plurality of program loops and program a page selected from among the plurality of pages. The peripheral circuit counts a number of memory cells whose threshold voltages have increased up to a first target voltage, among a part of memory cells included in the selected page. The peripheral circuit performs a current sensing check operation of determining whether a verify operation performed in a previous program loop has passed or failed. The control logic circuit is configured to control the peripheral circuit so that the current sensing check operation is performed when the number of memory cells, whose threshold voltages have increased up to the first target voltage, is equal to or greater than a reference number of memory cells.

An embodiment of the present disclosure may provide for a method of operating a memory device. The method may include performing a sub-program operation of applying a program voltage to a plurality of memory cells included in a selected page, performing a verify operation to verify threshold voltages of selected memory cells having a lowest target voltage, selected from among the plurality of memory cells, and comparing a number of passed bits detected in the verify operation with a reference number of passed bits, skipping a current sensing check operation of determining whether the verify operation has passed or failed in a next program loop when the number of passed bits is less than the reference number of passed bits, and performing the current sensing check operation from the next program loop when the number of passed bits is equal to or greater than the reference number of passed bits.

An embodiment of the present disclosure may provide for a method of operating a memory device. The method may include performing a plurality of program loops for increasing threshold voltages of memory cells in a selected page, wherein, in each of the plurality of program loops, when a number of memory cells whose threshold voltages have increased up to a target voltage, is less than a reference number of memory cells, a current sensing check operation of determining a result of a verify operation of a previous program loop is skipped, and when the number of memory cells whose threshold voltages have increased up to the target voltage, is equal to or greater than the reference number of memory cells, the current sensing check operation is performed.

DETAILED DESCRIPTION

Figure 1:
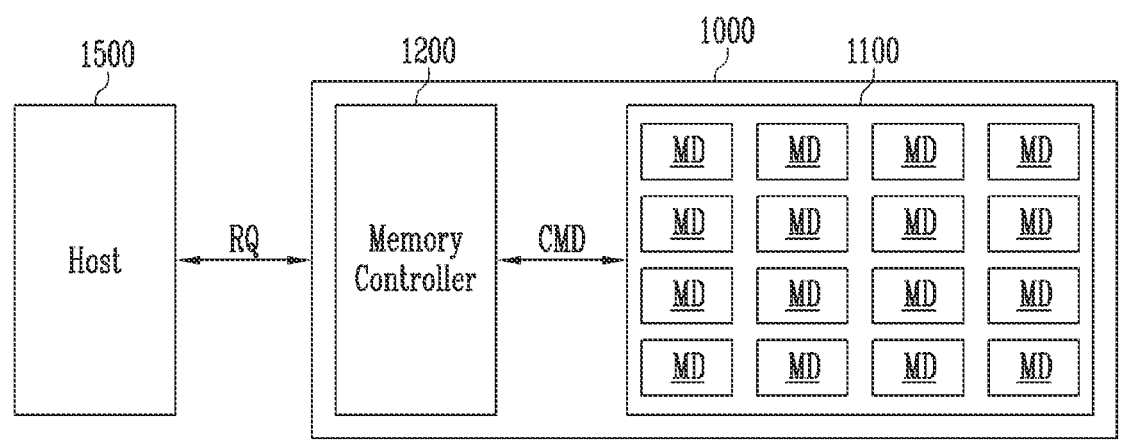
FIG. 1 is a block diagram illustrating a memory system according to an embodiment of the present disclosure.

FIG. 1 is a block diagram illustrating a memory system according to an embodiment of the present disclosure.

Referring to FIG. 1, a memory system 1000 may include a storage device 1100 and a memory controller 1200. The storage device 1100 may include a plurality of memory devices MD, which may be coupled to the memory controller 1200 through input/output lines.

The memory controller 1200 may perform communication between a host 1500 and the memory devices MD. The memory controller 1200 may generate commands CMD for controlling the memory devices MD in response to requests RQ from the host 1500 In addition, the memory controller 1200 may perform a background operation for improving the performance of the memory system 1000 even if requests RQ are not received from the host 1500.

The host 1500 may generate the requests RQ for various operations, and may output the generated requests RQ to the memory system 1000. For example, the requests RQ may include a program request for controlling a program operation, a read request for controlling a read operation, an erase request for controlling an erase operation, etc.

The host 1500 may communicate with the memory system 1000 through various interfaces, such as Peripheral Component Interconnect Express (PCIe), Advanced Technology Attachment (ATA), Serial ATA (SATA), Parallel ATA (PATH), serial attached SCSI (SAS), Non-Volatile Memory Express (NVMe), Universal Serial Bus (USB), Multi-Media Card (MMC), Enhanced Small Disk Interface (ESDI), or Integrated Drive Electronics (IDE).

Figure 2:
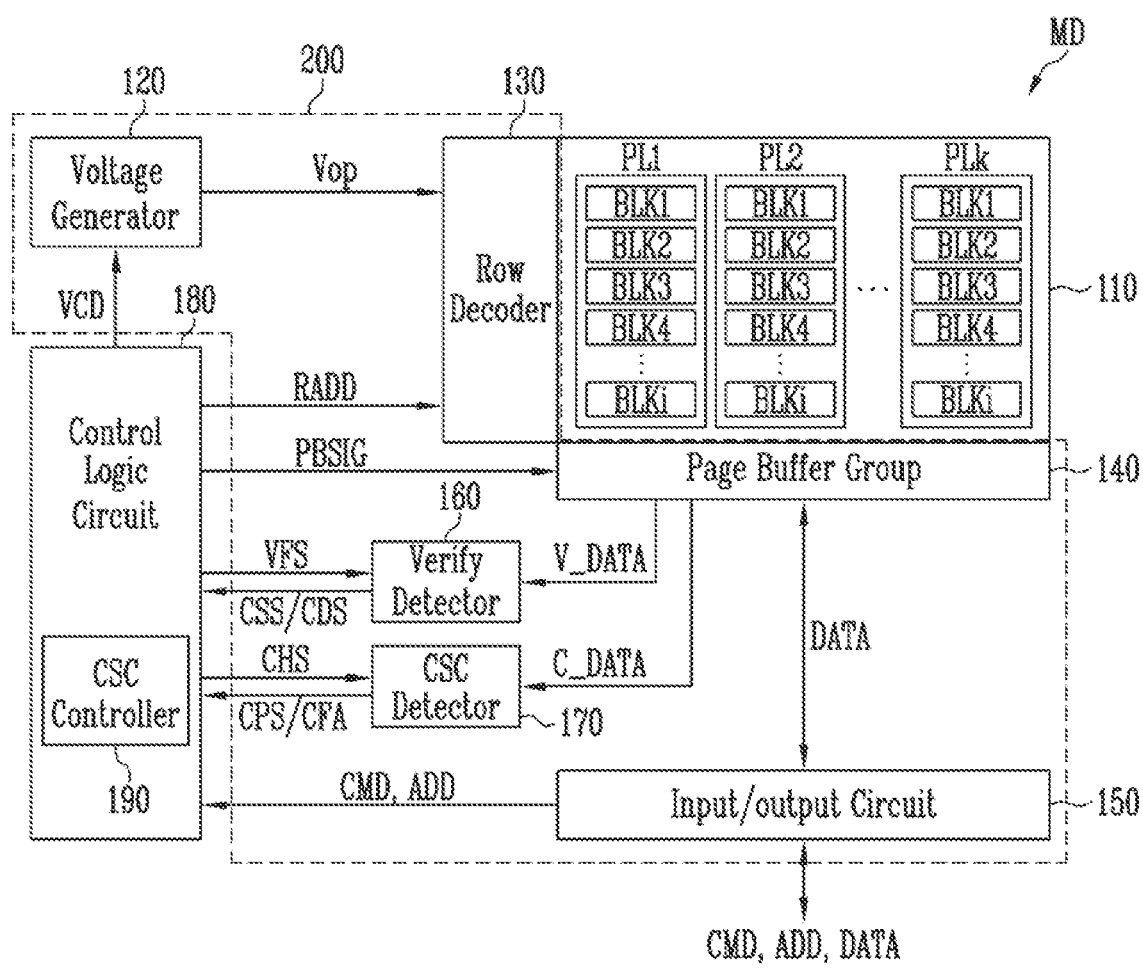
FIG. 2 is a block diagram illustrating a memory device according to an embodiment of the present disclosure.

FIG. 2 is a block diagram illustrating a memory device according to an embodiment of the present disclosure.

Referring to FIG. 2, a memory device MD may include a memory cell array 110 which stores data, a peripheral circuit 200 which performs a program operation, a read operation or an erase operation, and a control logic circuit 180 which controls the peripheral circuit 200.

The memory cell array 110 may include a plurality of planes PL1 to PLk (where k is a positive integer), and each of the planes PL1 to PLk may include a plurality of memory blocks BLK1 to BLKi (where i is a positive integer). Each of the memory blocks BLK1 to BLKi may include a plurality of memory cells, which may be implemented in a two-dimensional (2D) structure in which memory cells are horizontally arranged on a substrate, or in a three-dimensional (3D) structure in which memory cells are vertically stacked on a substrate.

The peripheral circuit 200 may include a voltage generator 120, a row decoder 130, a page buffer group 140, an input/output circuit 150, a verify detector 160, and a current sensing check (CSC) detector 170.

The voltage generator 120 may generate and output operating voltages Vop required for various operations in response to s voltage code VCD, For example, the voltage generator 120 may generate and output a program voltage, a verify voltage, a read voltage, a pass voltage, an erase voltage, etc., each voltage having various levels.

The row decoder 130 may select one memory block from among the plurality of memory blocks BLK1 to BLKi included in the memory cell array 110 in response to a row address RADD and transfer operating voltages Vop, and may transmit operating voltages Vop to the selected memory block.

The page buffer group 140 may be coupled to the memory cell array 110 through bit lines. For example, the page buffer group 140 may include a plurality of page buffers coupled to respective bit lines. The plurality of page buffers may be simultaneously operated in response to page buffer control signals PBSIG, and may temporarily store data during a program or read operation. A verify operation performed in a program operation and a verify operation performed in an erase operation may be performed in a manner similar to that of a read operation. For example, the page buffers may output verify data V_DATA or check data C_DATA sensed from the memory cells during a program operation. The verify data V_DATA may be chunk-unit data included in a selected page, and the check data C_DATA may be data of a selected page included in a selected memory block in each selected plane. Therefore, the check data C_DATA may include the verify data V_DATA.

The input/output circuit 150 may be coupled to a memory controller (e.g., 1200 of FIG. 1) through the input/output lines. The input/output circuit 150 may receive/output a command CMD, an address ADD, and data DATA through the input/output lines. For example, the input/output circuit 150 may receive the command CMD and the address ADD through the input/output lines and transfer the command CMD and the address ADD to the control logic circuit 180. The input/output circuit 150 may transmit the data DATA, received from the memory controller 1200 through the input/output lines, to the page buffer group 140. Further, during a read operation, the input/output circuit 150 may output read data DATA, received from the page buffer group 140, to the memory controller 1200 through the input/output lines.

The verify detector 160 may output a check start signal CSS or a check delay signal CDS during a program operation depending on the number of memory cells whose threshold voltages have reached a selected target voltage. For example, the verify detector 160 may receive the verify data V_DATA from the page buffer group 140 in response to a verify signal VFS, may compare the number of passed bits in the verify data V_DATA with the reference number of passed bits, and may output the check start signal CSS or the check delay signal CDS based on the result of the comparison. For example, the verify detector 160 may receive the verify data V_DATA from a selected memory block included in a selected plane, and may count the number of passed bits included in the received verify data V_DATA. That is, in order to rapidly determine the program state of selected memory cells in the initial stage of the program operation, the verify detector 160 may receive the verify data V_DATA from any one plane selected from among the plurality of planes PL1 to PLk, and may count the number of passed bits included in the verify data V_DATA. The verify data V_DATA may be part of data sensed from a selected page in a selected memory block included in the selected plane. For example, the verify data V_DATA may be data divided into chunks among pieces of data in the selected page. Here, the term "chunk" may be a unit smaller than a page. For example, assuming that the capacity of one page is 10 kilobytes (KB), the capacity of one chunk may be set to 1 KB. In this case, the verify detector 160 may receive 1 KB-verify data V_DATA from the page buffer group 140, and may count the number of passed chunk bits included in the received verify data V_DATA. When the number of passed chunk bits is counted, the verify detector 160 may compare the number of passed chunk bits with the reference number of passed chunk bits, and may output the check start signal CSS or the check delay signal CDS based on the result of the comparison. For example, when the number of passed chunk bits is equal to or greater than the reference number of passed chunk bits, the verify detector 160 may output the check start signal CSS, whereas when the number of passed chunk bits is less than the reference number of passed chunk bits, the verify detector 160 may output the check delay signal CDS.

The current sensing check detector 170 may determine whether a verify operation has passed or failed. For example, the current sensing check detector 170 may receive the check data C_DATA from the page buffer group 140 in response to a check enable signal CHS, may compare the number of failed page bits included in the check data C_DATA with the allowable number of failed page bits, and may output a check pass signal CPS or a check fail signal CFA based on the result of the comparison. For example, the current sensing check detector 170 may output the check pass signal CPS when the number of failed page bits is less than the allowable number of failed page bits. The current sensing check detector 170 may output the check fail signal CFA when the number of failed page bits is equal to or greater than the allowable number of failed page bits. When at least one plane, among the plurality of planes PL1 to PLk, has passed the verify operation, the current sensing check detector 170 may determine that the program operation has passed and output a check pass signal CPS even if verify operations on the remaining planes have failed. For example, the current sensing check detector 170 may output the check pass signal CPS when all of the planes PL1 to PLk have passed the verify operations, and may output the check pass signal CPS even if one of the planes PL1 to PLk has passed the verify operation.

The control logic circuit 180 may output the voltage code VCD, the row address RADD, the page buffer control signals PBSIG, the verify signal VFS, and the check enable signal CHS in response to the command CMD and the address ADD. For example, the control logic circuit 180 may include software which executes an algorithm in response to the command CMD, and hardware which outputs various signals depending on the address ADD and the algorithm. Also, the control logic circuit 180 may include a current sensing check (CSC) controller 190 that is capable of controlling a current sensing check operation depending on the program states of memory cells during a program operation.

The current sensing check (CSC) controller 190 may output a verify signal VFS for activating the verify detector 160 during the program operation. In addition, the current sensing check (CSC) controller 190 may output the check enable signal CHS for activating the current sensing check (CSC) detector 170 in response to the check start signal CSS or the check delay signal CDS. Also, the current sensing check controller 190 may determine whether the program operation performed on the selected pages has been completed in response to the check pass signal CPS or the check fail signal CFA.

Figure 3:
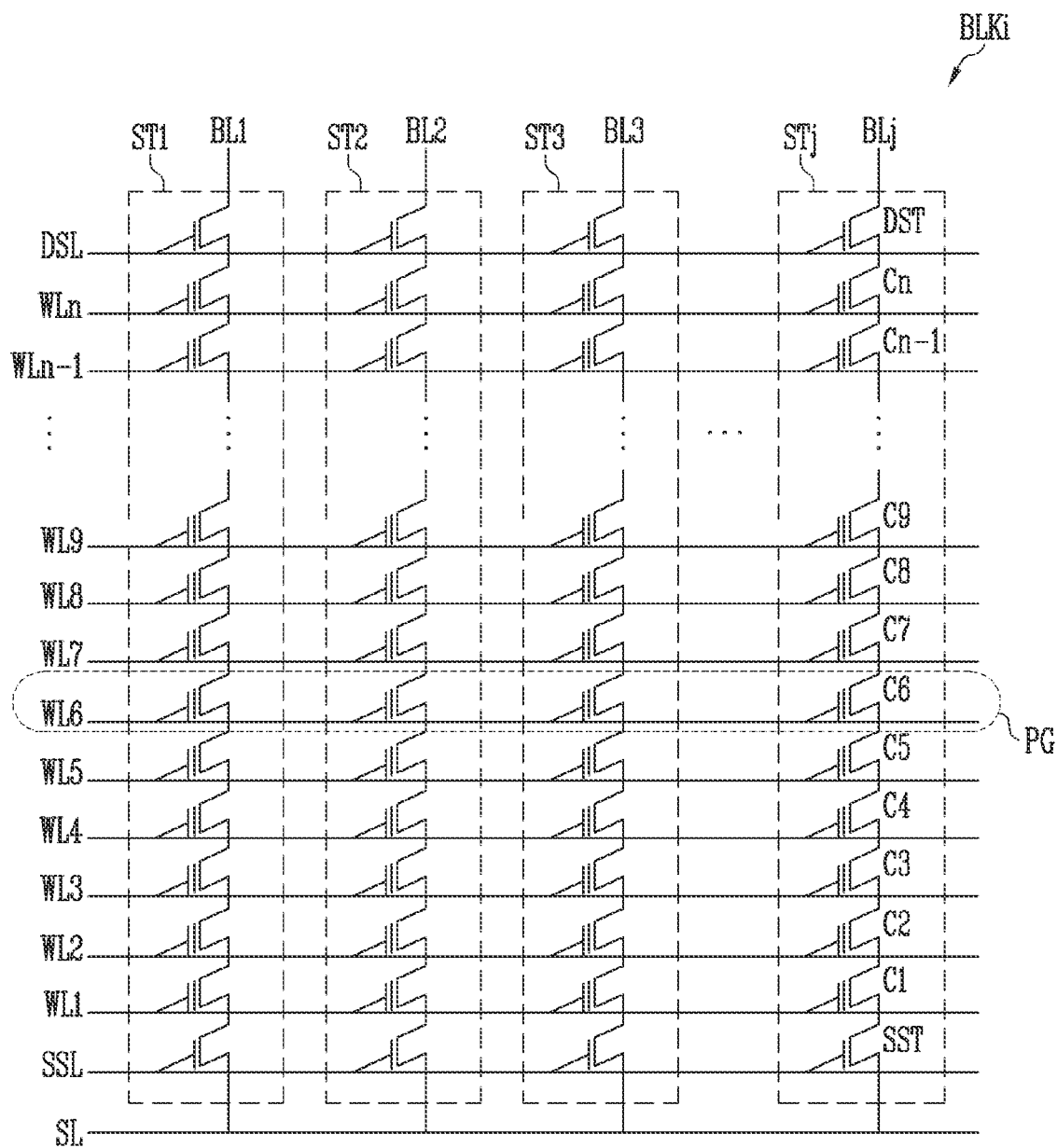
FIG. 3 is a diagram illustrating a memory block according to an embodiment of the present disclosure.

FIG. 3 is a diagram illustrating a memory block according to an embodiment of the present disclosure, wherein an i-th memory block BLKi, among the plurality of memory blocks BLK1 to BLKi of FIG. 2, is illustrated by way of example.

Referring to FIG. 3, the i-th memory block BLKi may include a plurality of strings ST1 to STj (where j is a positive integer). The first to j-th strings ST1 to STj may be coupled between bit lines BL1 to BLj and a source line SL. For example, the first string ST1 may be coupled between the first bit line BL1 and the source line SL, the second string ST2 may be coupled between the second bit line BL2 and the source line SL, and the j-th string STj may be coupled between the j-th bit line BLj and the source line SL.

Each of the first to j-th strings ST1 to STj may include a source select transistor SST, a plurality of memory cells C1 to Cn (where n is a positive integer), and a drain select transistor DST, Each of the first to j-th strings ST1 to STj may further include dummy cells between the memory cells C1 to Cn and source or drain select transistors SST or DST although not illustrated in the drawing. The configuration of the j-th string STj is described in detail below by way of example.

The source select transistor SST included in the j-th string STj may electrically couple or decouple the source line SL and the first memory cell C1 to or from each other depending on the voltage applied to a source select line SSL. Gates of the first to n-th memory cells C1 to Cn may be coupled to first to n-th word lines WL1 to WLn, respectively. The drain select transistor DST may electrically couple or decouple the j-th bit line BLj and the n-th memory cell Cn to or from each other depending on the voltage applied to a drain select line DSL. Gates of the source select transistors SST included in different strings ST1 to STj may be coupled in common to the source select line SSL, gates of the first to n-th memory cells C1 to Cn may be coupled to the first to n-th word lines WL1 to WLn, and gates of the drain select transistors DST may be coupled in common to the drain select line DSL. A group of memory cells coupled to the same word line may be referred to as a page (PG), and a program operation and a read operation may be performed on a page (PG) basis.

The program operation according to the present embodiment may be performed in an incremental step pulse program (ISPP) manner in which a program voltage is increased in steps. During a program operation performed in the ISPP manner, a plurality of program loops may be performed until the threshold voltages of selected memory cells are increased up to a target voltage, and the program voltage may be increased in steps whenever each program loop is performed. In each program loop, a sub-program operation of increasing the threshold voltages of selected memory cells and a verify operation of determining whether the threshold voltages of the selected memory cells have increased up to the target voltage may be performed. In the sub-program operation, a program voltage may be applied to a selected word line, and in the verify operation, a verify voltage may be applied to a selected word line. Depending on data sensed from memory cells during the verify operation, determination of whether the verify operation has passed or failed may be performed during a sub-program operation of a next program loop. During the sub-program operation, an operation of determining whether the verify operation has passed or failed may be a current sensing check operation.

In the present embodiment, when the number of memory cells whose threshold voltages have increased up to a target voltage, among memory cells having the lowest target voltage, is equal to or greater than the specific number of memory cells, the current sensing check operation may be performed. That is, since the current sensing check operation is performed on selected pages of selected memory blocks included in all selected planes, a long time may be taken. Therefore, in the present embodiment, the time required for the program operation may be shortened by skipping the current sensing check operation in some program loops.

Figure 4:
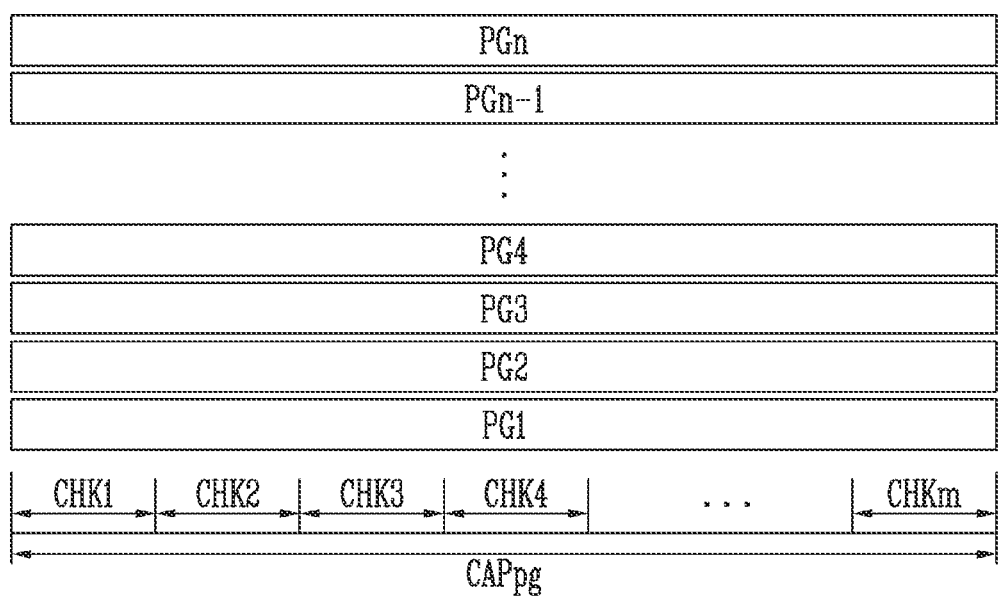
FIG. 4 is a block diagram illustrating a plurality of pages included in a memory block.

FIG. 4 is a block diagram illustrating a plurality of pages included in a memory block.

Referring to FIG. 4, the memory block may include a plurality of pages PG1 to PGn (where n is a positive integer). Since each of the plurality of pages PG1 to PGn includes a plurality of memory cells which may store data, the storage capacity CAPpg of each of the pages PG1 to PGn may be determined depending on the number of memory cells, Recently, as the number of memory cells included in each of the pages PG1 to PGn has increased, the page storage capacity CAPpg has increased.

As described above, a program operation is performed on a page basis, wherein a chunk unit may be used to easily process data as the page storage capacity CAPpg increases. For example, each page may be divided into first to m-th chunks CHK1 to CHKm (where m is a positive integer). The first to m-th chunks CHK1 to CHKm may be divided depending on a uniform capacity or various capacities. The page buffer group (e.g., 140 of FIG. 1) may receive/output data on a chunk basis, or may receive/output data regardless of chunks. When the first page PG1 is a selected page, data in all memory cells included in the first page PG1 may be stored in page buffers during a verify operation performed in a program operation so that the page buffers may output the data on a chunk basis.

Figure 5:
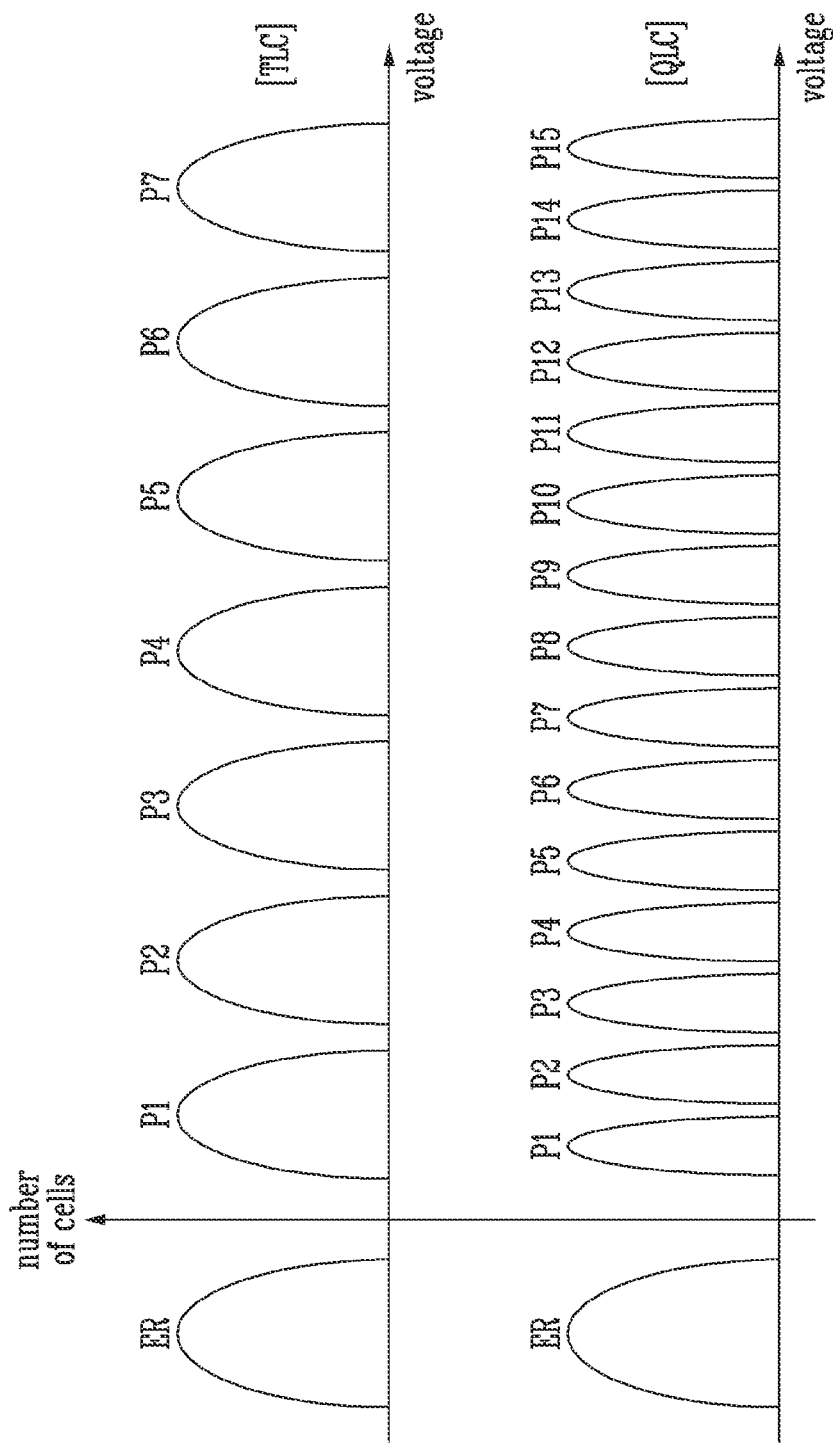
FIG. 5 is a diagram illustrating threshold voltage distributions of memory cells.

FIG. 5 is a diagram illustrating threshold voltage distributions of memory cells.

Referring to FIG. 5, a program operation may be classified into various schemes depending on the number of bits stored in each memory cell. For example, a scheme in which three bits of data are stored in one memory cell is referred to as a triple-level cell (TLC) scheme, and a scheme in which four bits of data are stored in one memory cell is referred to as a quadruple-level cell (QLC) scheme.

In the TLC scheme, the state of each memory cell may be identified as one erased state ER or as any one of seven program states P1 to P7. In the QLC scheme, the state of each memory cell may be identified as one erased state ER or as any one of 15 program states P1 to P15.

The number of bits that may be stored in one memory cell may be 5 or more, and the present embodiment does not limit the number of bits to be stored in each memory cell.

Figure 6:
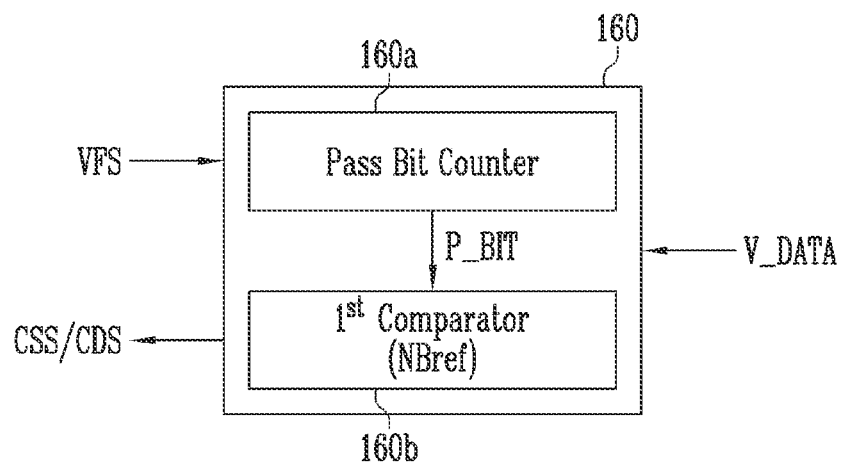
FIG. 6 is a block diagram illustrating a verify detector according to an embodiment of the present disclosure.

FIG. 6 is a block diagram illustrating a verify detector according to an embodiment of the present disclosure.

Referring to FIG. 6, the verify detector 160 may include a pass bit counter 160a and a first comparator 160b. When a verify signal VFS is input, the pass bit counter 160a may receive verify data V_DATA from the page buffer group (e.g., 140 of FIG. 2), and may count the number of passed chunk bits P_BIT included in the received verify data V_DATA, For example, the verify data V_DATA may be data of a selected chunk in a selected page included in a selected memory block of a selected plane. When the number of all passed chunk bits P_BIT has been counted, the pass bit counter 160a may transmit the number of passed chunk bits P_BIT to the first comparator 160b.

The first comparator 160b may store the preset reference number of passed chunk bits NBref, and may compare the number of passed chunk bits P_BIT with the reference number of passed chunk bits NBref. The first comparator 160b may then output a check start signal CSS or a check delay signal CDS based on the result of the comparison. For example, when the number of passed chunk bits P_BIT is equal to or greater than the reference number of passed chunk bits NBref, the first comparator 160b may output a check start signal CSS. When the number of passed chunk bits P_BIT is less than the reference number of passed chunk bits NBref, the first comparator 160b may output a check delay signal CDS. Further, the first comparator 160b may output a check start signal CSS even when the number of chunk bits P_BIT of all chunks in the selected page is equal to or greater than the reference number of passed chunk bits NBref.

The operation of the verify detector 160 based on the number of passed chunk bits P_BIT will be described below.

Figure 7A:
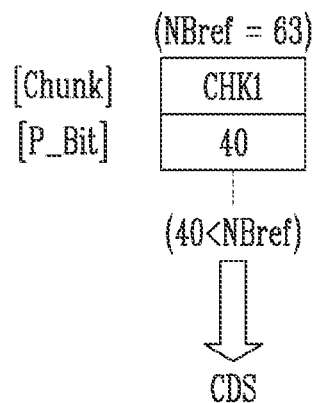
FIGS. 7A and 7B are block diagrams illustrating a first embodiment in which the verify detector may determine a passed bit in verify data.
Figure 7B:
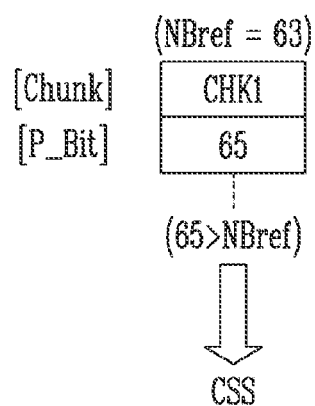

FIGS. 7A and 7B are diagrams illustrating a first embodiment in which the verify detector determines a passed bit in verify data.

Referring to FIGS. 6, 7A, and 7B, in the first embodiment, the verify detector 160 may receive only verify data V_DATA of one selected chunk. Then, the verify detector 160 may output a check start signal CSS or a check delay signal CDS depending on the result of a comparison between the number of passed chunk bits P_BIT included in the verify data V_DATA and the reference number of passed chunk bits NBref.

Referring to FIGS. 6 and 7A, for better understanding of the present embodiment, it is assumed that the reference number of passed chunk bits NBref is 63 and may be set to different values depending on the memory device. When the number of passed chunk bits P_BIT is 40, the first comparator 160b may output a check delay signal CDS because the number of passed chunk bits P_BIT is less than the reference number of passed chunk bits NBref.

Referring to FIGS. 6 and 7B, when the number of passed chunk bits P_BIT is 65, the first comparator 160b may output a check start signal CSS because the number of passed chunk bits P_BIT is equal to or greater than the reference number of passed chunk bits NBref.

Figure 8:
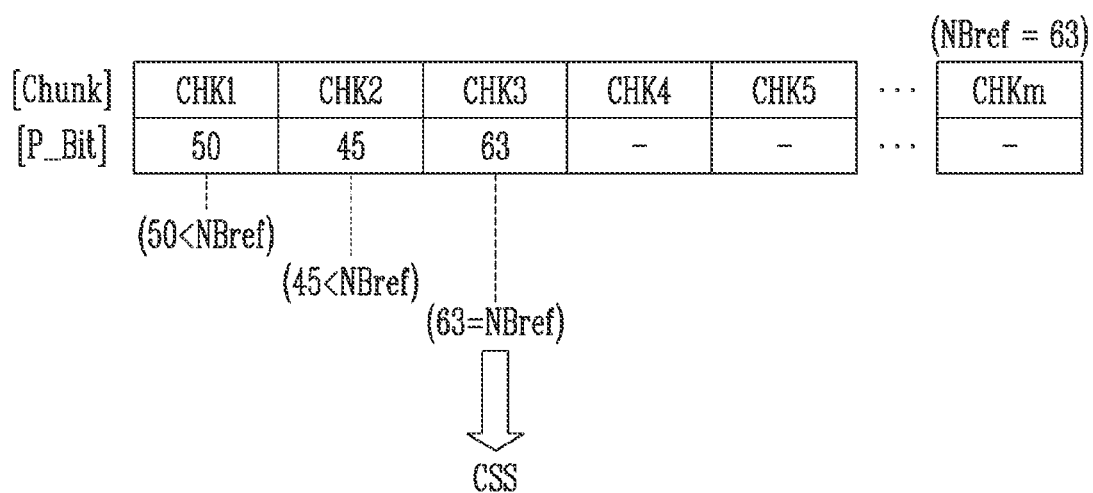
FIG. 8 is a block diagram illustrating a second embodiment in which the verify detector may determine a passed bit in verify data.

FIG. 8 is a block diagram illustrating a second embodiment in which the verify detector determines a passed bit in verify data.

Referring to FIGS. 6 and 8, in a second embodiment, the verify detector 160 may sequentially receive pieces of verify data V_DATA on a chunk basis, and may compare the number of chunk bits P_BIT included in the received verify data V_DATA of each chunk with the reference number of passed chunk bits NBref. That is, the verify detector 160 may determine whether, among the plurality of chunks included in the selected page, a chunk has been detected in which the number of passed chunk bits P_BIT is equal to or greater than the reference number of passed chunk bits NBref, and may stop the reception of verify data V_DATA when the chunk has been detected in which the number of passed chunk bits P_BIT is equal to or greater than the reference number of passed chunk bits NBref.

For example, the verify detector 160 may receive verify data V_DATA from a first chunk CHK1, and may count the number of passed chunk bits P_BIT included in the verify data V_DATA. When the number of passed chunk bits P_BIT in the first chunk CHK1 is detected as being 50 or 50 bits, the number of passed chunk bits P_BIT is less than the reference number of passed chunk bits NBref, and thus the verify detector 160 may receive verify data V_DATA from a second chunk CHK2. When the number of passed chunk bits P_BIT in the second chunk CHK2 is detected as being 45 bits, the number of passed chunk bits P_BIT is less than the reference number of passed chunk bits NBref, and thus the verify detector 160 may receive verify data V_DATA from a third chunk CHK3. When the number of passed chunk bits P_BIT in the third chunk CHK3 is detected as being 63 bits, the number of passed chunk bits P_BIT is equal to the reference number of passed chunk bits NBref, and thus the verify detector 160 may output a check start signal CSS without receiving verify data V_DATA from fourth to m-th chunks CHK4 to CHKm. That is, when the number of passed chunk bits P_BIT is equal to or greater than the reference number of passed chunk bits NBref, the verify detector 160 may output the check start signal CSS, and may stop the operation of comparing the number of passed chunk bits P_BIT with the reference number of passed chunk bits NBref.

Figure 9A:
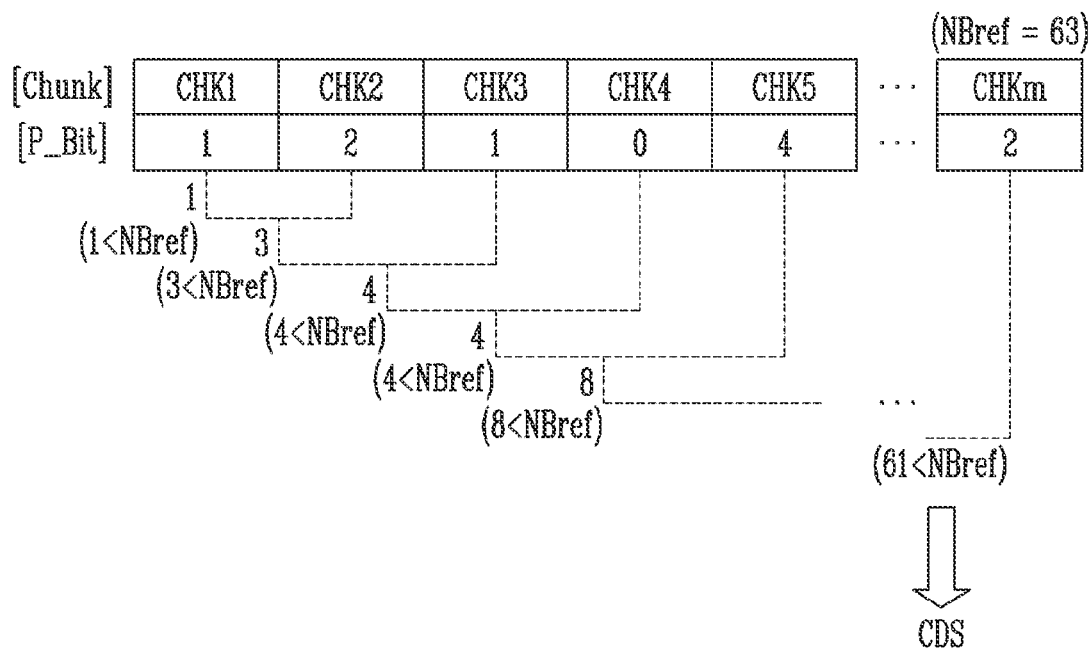
FIGS. 9A and 9B are block diagrams illustrating a third embodiment in which the verify detector may determine a passed bit in verify data.
Figure 9B:
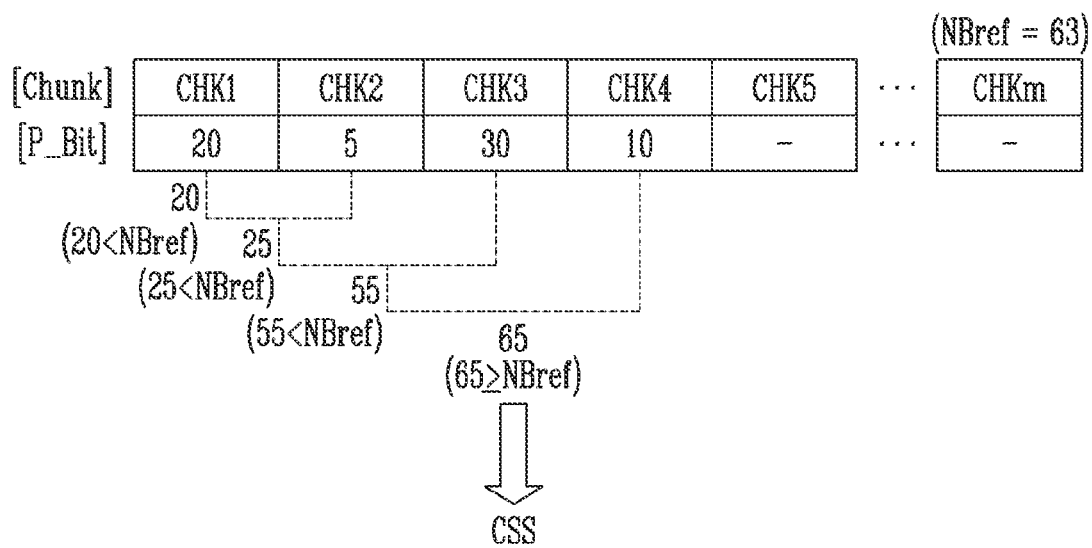

FIGS. 9A and 9B are block diagrams illustrating a third embodiment in which the verify detector determines a passed bit in verify data.

Referring to FIGS. 6, 9A, and 9B, in the third embodiment, the verify detector 160 may sequentially receive pieces of verify data V_DATA from first to m-th chunks CHK1 to CHKm, may accumulate the results of a comparison between the number of passed chunk bits P_BIT included in the verify data V_DATA and the reference number of passed chunk bits NBref, and may output a check start signal CSS or a check delay signal CDS depending on the accumulated value.

Referring to FIGS. 6 and 9A, the verify detector 160 may receive verify data V_DATA from the first chunk CHK1, and may count the number of passed chunk bits P_BIT included in the received verify data V_DATA. When the number of passed chunk bits P_BIT in the first chunk CHK1 is 1, 1 is less than the reference number of passed chunk bits NBref, and thus the verify detector 160 may receive verify data V_DATA from the second chunk CHK2. When the number of passed chunk bits P_BIT in the second chunk CHK2 is 2, the verify detector 160 may calculate a value obtained by summing '1', which is the number of passed chunk bits P_BIT in the first chunk CHK1, and '2', which is the number of passed chunk bits P_BIT in the second chunk CHK2. When the calculated value is 3, 3 is less than the reference number of passed chunk bits NBref, and thus the verify detector 160 may receive verify data V_DATA from the third chunk CHK3. When the number of passed chunk bits P_BIT in the third chunk CHK3 is 1, the verify detector 160 may calculate a new value obtained by summing '3', which is the previously calculated value, and '1', which is the number of passed chunk bits P_BIT in the third chunk CHK3. In this way, assuming that a value obtained by summing the numbers of passed chunk bits P_BIT in the first to m-th chunks CHK1 to CHKm is 61, 61 is less than the reference number of passed chunk bits NBref, and thus the verify detector 160 may output a check delay signal CDS.

Referring to FIGS. 6 and 9B, when the numbers of passed chunk bits P_BIT counted in the first to fourth chunks CHK1 to CHK4 are 20, 5, 30, and 10, respectively, a value obtained by summing all of the numbers of passed chunk bits P_BIT may be 65, In this case, since the F, calculated value is greater than the reference number of passed chunk bits NBref, the verify detector 160 may output a check start signal CSS without receiving verify data V_DATA from the fifth to m-th chunks CHK5 to CHKm.

Figure 10:
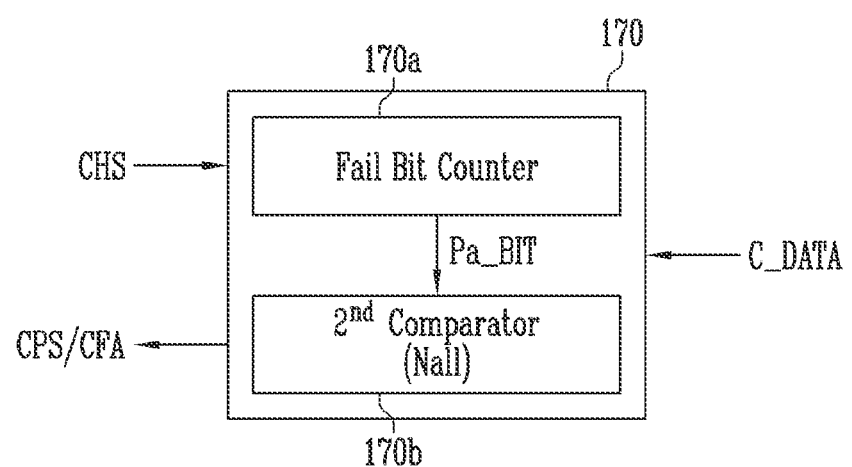
FIG. 10 is a block diagram illustrating a current sensing check detector according to an embodiment of the present disclosure.

FIG. 10 is a block diagram illustrating a current sensing check detector according to an embodiment of the present disclosure.

Referring to FIG. 10, the current sensing check detector 170 may include a fail bit counter 170a and a second comparator 170b.

The fail bit counter 170a may receive check data C_DATA from a selected plane in response to a check enable signal CHS, may count the number of failed bits included in the check data C_DATA, and may output the number of failed page bits Pa_BIT. For example, the fail bit counter 170a may sequentially receive pieces of check data C_DATA from planes on which a program operation is performed, and may output the number of failed page bits Pa_BIT included in each of the pieces of check data C_DATA. For example, the check data C_DATA may include verify data received from the chunks included in the selected page. The fail bit counter 170a may output the number of failed page bits Pa_BIT in the check data C_DATA received from the selected page of each plane.

The second comparator 170b may compare the number of failed page bits Pa_BIT with the preset allowable number of failed page bits Nall, and may output a check pass signal CPS or a check fail signal CFA depending on the result of the comparison. The allowable number of failed page bits denotes the maximum number of correctable errors included in a page. When the number of failed page bits Pa_BIT is less than or equal to the allowable number of failed page bits Nall, the second comparator 170b may output a check pass signal CPS. Alternatively, when the number of failed page bits Pa_BIT is greater than the allowable number of failed page bits Nall, the second comparator 170b may output a check fail signal CFA.

The operation of the current sensing check detector 170 will be described in detail below.

Figure 11A:
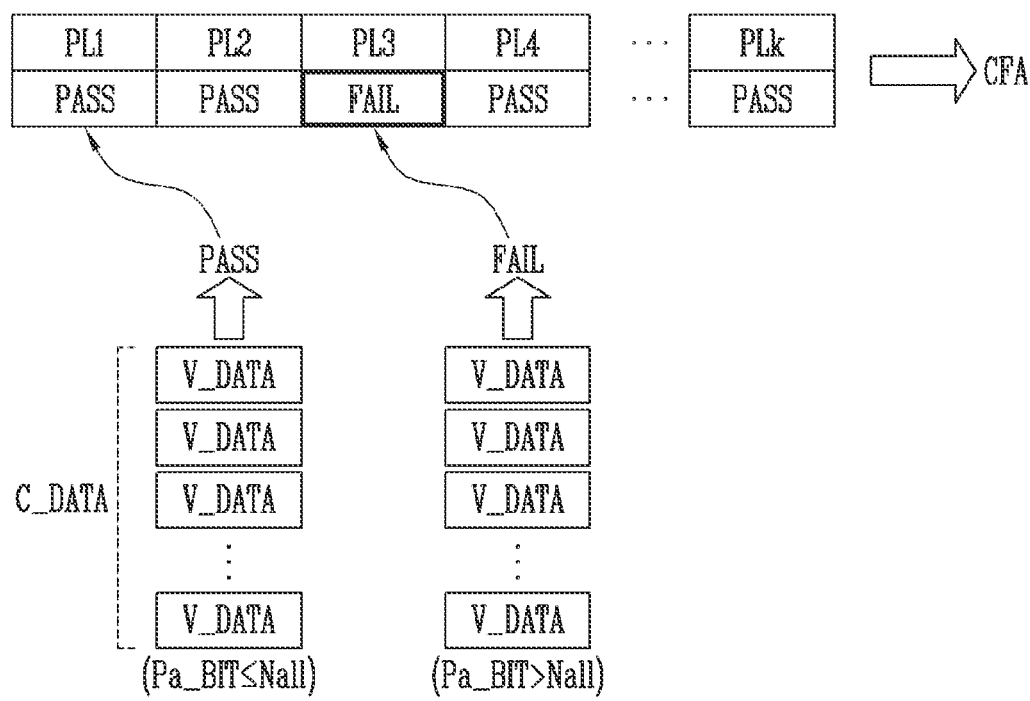
FIGS. 11A and 11B are block diagrams illustrating a method in which the current sensing check detector may determine a pass or fail in a verify operation depending on check data.
Figure 11B:
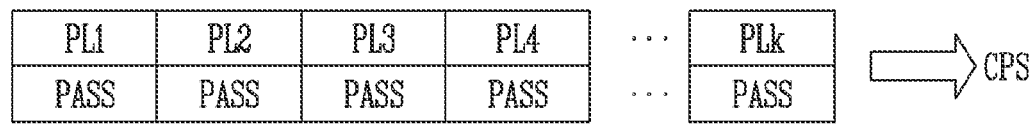

FIGS. 11A and 11B are block diagrams illustrating a method in which the current sensing check detector determines a pass or fail in a verify operation depending on check data.

Referring to FIGS. 10 and 11A, the current sensing check detector 170 may receive check data C_DATA from all planes on which a program operation is performed, and may compare the number of failed page bits Pa_BIT included in the check data C_DATA with the allowable number of failed page bits Nall. For example, the current sensing check detector 170 may sequentially receive pieces of verify data V_DATA of a selected page included in a selected memory block of a first plane PL1, and may count the number of failed page bits Pa_BIT in all of the pieces of received verify data V_DATA, Here, all pieces of verify data V_DATA received from the selected page of the selected plane may be check data C_DATA. When the number of faded page bits Pa_BIT included in the check data C_DATA received from the first plane PL1 is less than or equal to the allowable number of failed page bits Nall, the current sensing check detector 170 may determine that a current sensing check operation on the first plane PL1 passed. In this way, the current sensing check detector 170 may receive pieces of check data C_DATA from first to k-th planes PL1 to PLk, respectively, and may determine whether the current sensing check operation on each plane has passed or failed. As illustrated in FIG. 11A, when a current sensing check operation performed on at least one plane, among the first to k-th planes PL1 to PLk, is determined to have failed, the current sensing check detector 170 may output a check fail signal CFA.

Referring to FIGS. 10 and 11B, when all current sensing check operations on the first to k-th planes PL1 to PLk are determined to have passed, the current sensing check detector 170 may output a check pass signal CPS.

Figure 12:
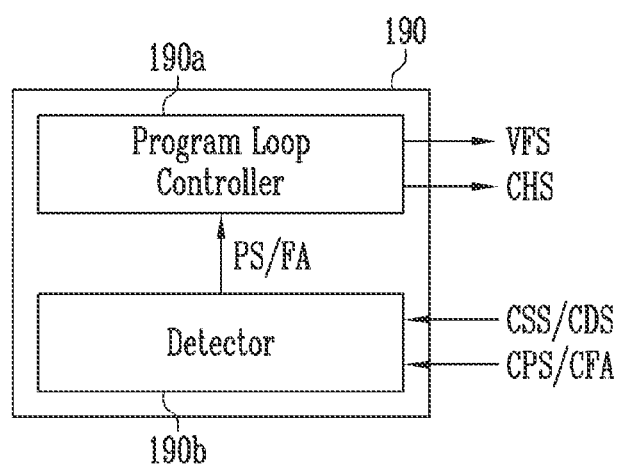
FIG. 12 is a block diagram illustrating a current sensing check controller according to an embodiment of the present disclosure.

FIG. 12 is a block diagram illustrating a current sensing check controller according to an embodiment of the present disclosure.

Referring to FIG. 12, the current sensing check controller 190 may include a program loop controller 190a and a detector 190b.

The program loop controller 190a may output a verify signal VFS or a check enable signal CHS depending on a result of performing a verify operation or a current sensing check operation of a program loop performed on a selected page. For example, the program loop controller 190a may output the verify signal VFS or the check enable signal CHS in response to a pass signal PS or a fail signal FA that is input during a verify operation or a current sensing check operation.

The detector 190b may output the pass signal PS or the fail signal FA in response to a check start signal CSS or a check delay signal CDS that may be input during an operation of determining the number of memory cells in a first program state. Then, the detector 190b may output the pass signal PS or the fail signal FA in response to a check pass signal CPS or a check fail signal CFA that may be input during a verify operation for each program state.

Figure 13:
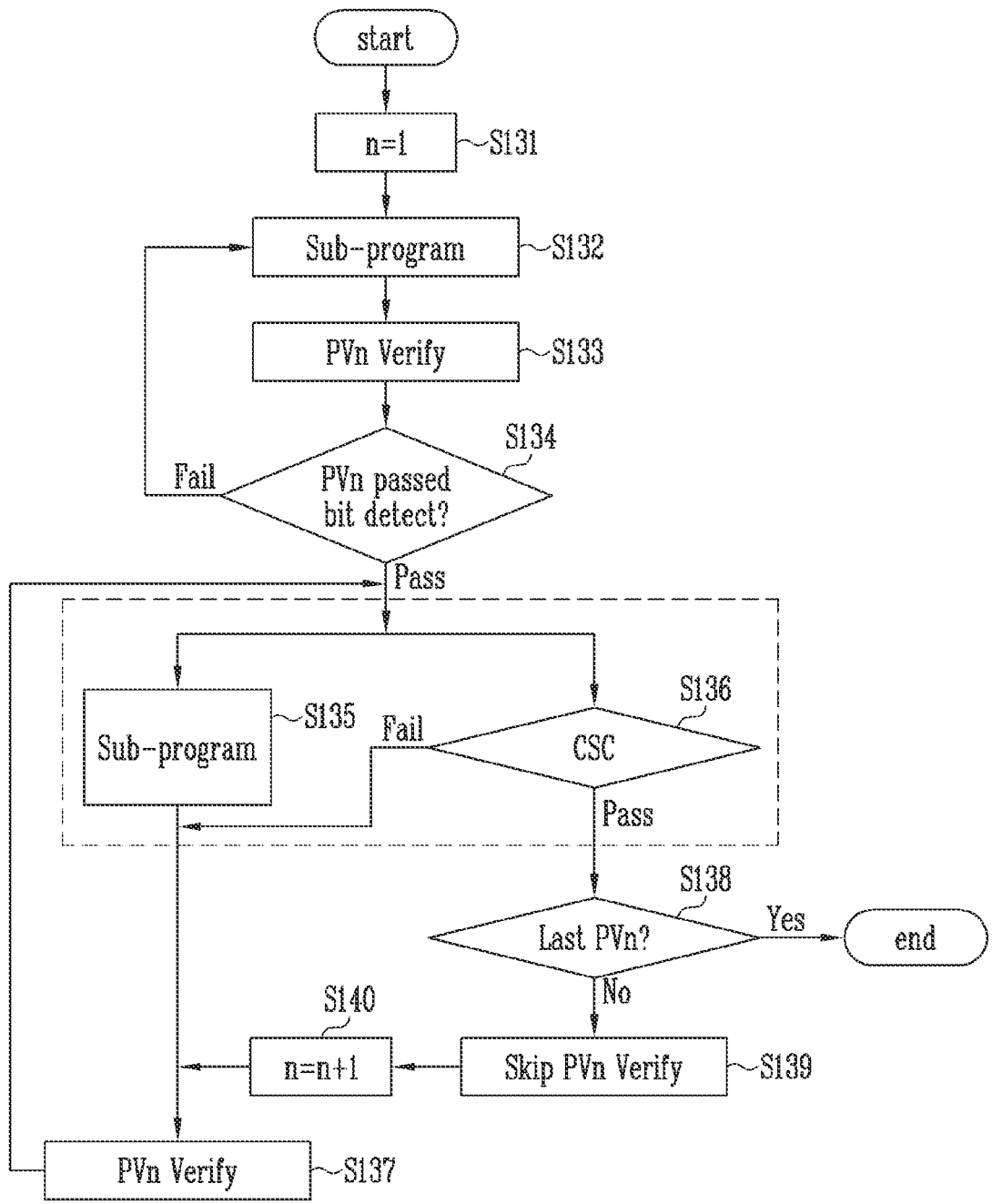
FIG. 13 is a flowchart illustrating a program operation according to an embodiment of the present disclosure.

FIG. 13 is a flowchart illustrating a program operation according to an embodiment of the present disclosure.

Referring to FIG. 13, during a program operation according to the present embodiment, a current sensing check operation of determining whether a verify operation has passed or failed may be skipped until, among selected memory cells having the lowest target voltage, the number of memory cells whose threshold voltages have increased up to a target voltage, reaches the preset number of memory cells. The current sensing check operation may be performed since, among the memory cells having the lowest target voltage, the number of memory cells whose threshold voltages have increased up to the target voltage has reached the preset number of memory cells. A program operation according to the present embodiment will be described in detail below.

The value n, which indicates the order of target voltages, may be set to 1 at step S131. For example, in a triple-level cell (TLC) scheme in which three bits of data are stored in one memory cell, there may be seven different target voltages for distinguishing program states. In a quadruple-level cell (QLC) scheme in which four bits of data are stored in one memory cell, there may be 15 different target voltages (see TLC or QLC of FIG. 5). In the TLC or QLC scheme, the lowest target voltage may be a first target voltage, and the program operation may start from the first target voltage. Therefore, at step S131, '1' may be set as an initial value for n. While the program operation is performed, n may change from 1 to 7 in the TLC scheme, and n may change from 1 to 15 in the QLC scheme.

A sub-program operation may be performed on selected memory cells at step S132. The sub-program operation may be an operation of applying a program voltage to a selected word line to increase the threshold voltages of the selected memory cells. When the sub-program operation is initially performed, a start program voltage may be applied to the selected word line. The start program voltage may be the lowest voltage, among program voltages applied to the selected word line.

After the program voltage has been applied for a predetermined period of time, a verify operation for an n-th target voltage PVn may be performed at step S133. The verify operation may be performed by applying an n-th verify voltage to the selected word line.

After the verify operation at step S133 has been performed for a predetermined period of time, an operation of determining whether bits of memory cells whose threshold voltages have increased up to the n-th target voltage have been detected, may be performed at step S134. Since n is 1, the number of memory cells whose threshold voltages have increased up to a first target voltage having the lowest level, among a plurality of target voltages, may be counted at step S134, and a pass or fail may be determined by comparing the counted number with the reference number of memory cells. For example, the verify detector 160 illustrated in FIG. 6 may determine a pass or fail by comparing the number of passed chunk bits P_BIT included in the verify data V_DATA with the reference number of passed chunk bits NBref. When the number of passed chunk bits P_BIT is less than the reference number of passed chunk bits NBref, the program voltage may be increased, and the sub-program operation at step S132 may be performed using the increased program voltage. That is, when step S134 fails, a next program loop may be performed. Steps S132 to S134 may be repeated while the program voltage is increased in steps until step S134 passes. Step S134 may pass when the number of passed chunk bits P_BIT is equal to or greater than the reference number of passed chunk bits NBref.

When step S134 has passed, a next program loop may be performed, and then a current sensing check (CSC) operation may be performed at step S136. For example, the current sensing check operation at step S136 may be performed when the sub-program operation at step S135 is performed. The sub-program operation and the current sensing check operation S136 will be described in detail below.

When step S134 has passed, the sub-program operation may be performed at step S135. The sub-program operation may be an operation of applying a program voltage to a selected word line to increase the threshold voltages of the selected memory cells, and may be performed in a manner similar to that of step S132. At step S135, a program voltage higher than that used at step S132 may be used.

The current sensing check operation S136 corresponding to a verify operation of a previous program loop may be performed while the sub-program operation at step S135 is performed. For example, when the number of error bits detected in the verify operation of the previous program loop is greater than the allowable number of error bits, the current sensing check operation at step S136 may fail. Alternatively, when the number of error bits is less than or equal to the allowable number of error bits, the current sensing check operation S136 may pass.

When the current sensing check (CSC) operation fails (in the case of Fail), a verify operation for the n-th target voltage PVn may be performed at step S137. The verify operation may be performed by applying the n-th verify voltage to the selected word line.

After the verify operation has been performed at step S137, the sub-program operation S135 and the current sensing check operation S136 corresponding to a next program loop may be performed. The sub-program operation S135 may be performed using a program voltage higher than that in the previous program loop. Then, the current sensing check operation S136 may determine whether the verify operation performed at step S137 has passed or failed.

When, in the current sensing check operation S136, the verify operation is determined to have passed (in the case of Pass), whether the n-th target voltage PVn is a last target voltage of the program operation is determined at step S138. The last target voltage may be the highest target voltage in the program operation. For example, when a program operation in a TLC scheme is performed, each of the selected memory cells may be programmed to first to seventh target voltages. When a first target voltage PV1 is the lowest voltage and a seventh target voltage PV7 is the highest voltage, the seventh target voltage PV7 may be the last target voltage.

When the n-th target voltage PVn is the last target voltage the case of Yes), the program operation performed on the selected page may be terminated.

When the n-th target voltage PVn is not the last target voltage (in the case of No), a verify operation for the n-th target voltage PVn may be skipped at step S139, and a next target voltage may be selected at step S140. For example, n may be changed to n+1 at step S140, and the verify operation S137 for the changed n-th target voltage PVn may be performed.

Steps S135 to S140 may be repeated until all current sensing check operations for the target voltages ranging to the last target voltage pass at step S138.

Figure 14A:
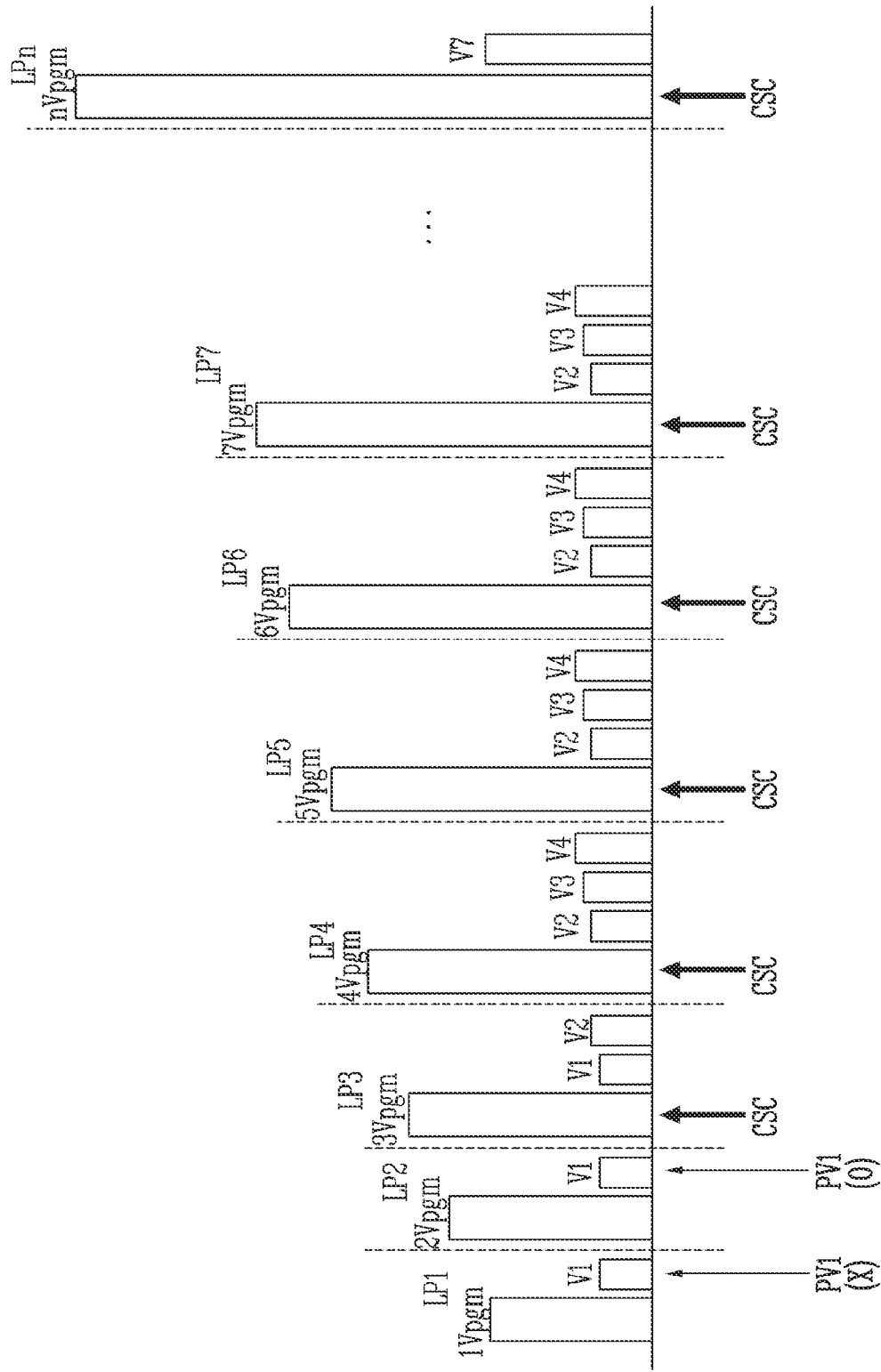
FIGS. 14A and 14B are diagrams illustrating a program operation according to a first embodiment of the present disclosure.
Figure 14B:
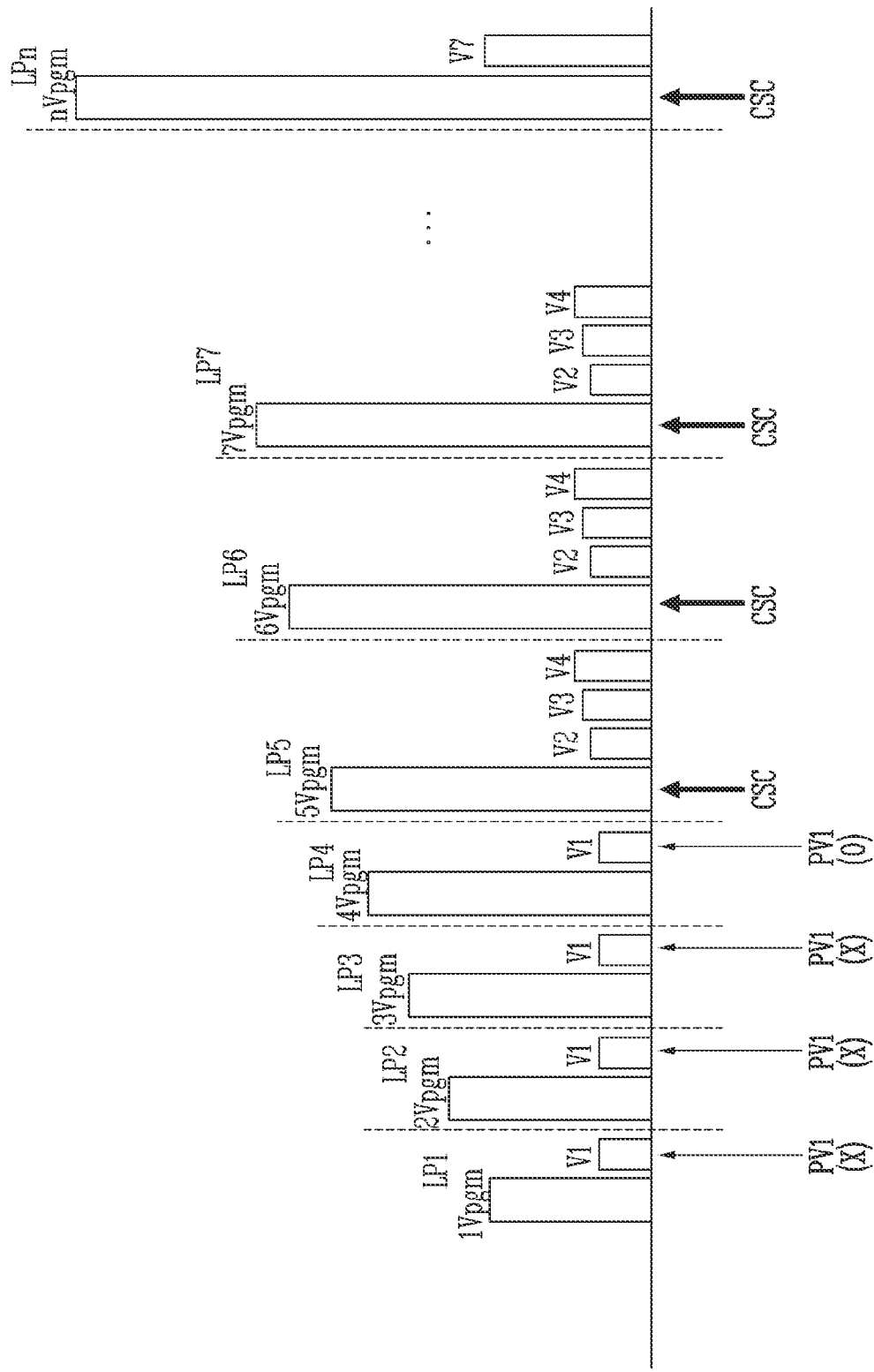

FIGS. 14A and 14B are diagrams illustrating a program operation according to a first embodiment of the present disclosure, and show an embodiment based on the flowchart of FIG. 13.

Referring to FIG. 14A, in a first program loop LP1, a sub-program operation using a first program voltage 1Vpgm and a first verify operation using a first verify voltage V1 may be performed. During the first verify operation using the first verify voltage V1, it may be determined whether the number of memory cells whose threshold voltages have increased up to the first verify voltage V1, has been detected as being equal to or greater than the reference number of memory cells. When it is determined in the first program loop LP1 that the number of memory cells whose threshold voltages have increased up to the first verify voltage V1 is less than the reference number of memory cells (X), a second program loop LP2 may be performed without a current sensing check (CSC) operation being performed.

In a second program loop LP2, a sub-program operation, which uses a second program voltage 2Vpgm higher than the first program voltage 1Vpgm by a step voltage, and the first verify operation, which uses the first verify voltage V1, may be performed. When it is determined in the second program loop LP2 that the number of memory cells whose threshold voltages have increased up to the first verify voltage V1, is equal to or greater than the reference number of memory cells (O), a current sensing check (CSC) operation nay be performed from a third program loop LP3.

In the third program loop LP3, a sub-program operation, which uses a third program voltage 3Vpgm higher than the second program voltage 2Vpgm by a step voltage, and first and second verify operations, which use first and second verify voltages V1 and V2, may be performed. The current sensing check (CSC) operation for the first verify operation of the second program loop LP2 may be performed during the sub-program operation of the third program loop LP3. When it is determined that the first verify operation of the second program loop LP2 has passed during the current sensing check (CSC) operation, the first verify operation may be skipped from a fourth program loop LP4. In the above-described manner, the remaining program loops, that is, fourth to n-th program loops LP4 to LPn may be performed, and the program operation on the selected page may be terminated when a seventh verify operation performed in the n-th program loop has passed, FIG. 14B is a diagram illustrating an embodiment in which the number of memory cells having passed a first verify operation gradually increases, compared to the embodiment of FIG. 14A.

Referring to FIG. 14B, when the number of memory cells having passed the first verify operation of first to third program loops LP1 to LP3 is detected as being less than the reference number of memory cells (X), and the number of memory cells having passed the first verify operation of a fourth program loop LP4 is detected as being equal to or greater than the reference number of memory cells (O), a current sensing check (CSC) operation may be performed from a fifth program loop LP5.

Figure 15:
FIG. 15 is a diagram illustrating a program operation according to a second embodiment of the present disclosure.

That is, in the first embodiment described with reference to FIGS. 14A and 14B, the current sensing check (CSC) operation may be skipped until the number of memory cells having passed the first verify operation using the first verify voltage V1 is detected as being equal to or greater than the reference number of memory cells, and a verify operation using a verify voltage higher than the verify voltage V1 may also be skipped, FIG. 15 is a diagram illustrating a program operation according to a second embodiment of the present disclosure.

Referring to FIG. 15, in the second embodiment, a current sensing check (CSC) operation and verify operations using next verify voltages may be skipped until the number of memory cells having passed the first verify operation using the first verify voltage V1 is detected as being equal to or greater than the reference number of memory cells. For example, when the number of memory cells having passed the first verify operation is detected as being less than the reference number of memory cells in the first and second program loops LP1 and LP2, and the number of memory cells having passed the first verify operation is detected as being equal to or greater than the reference number of memory cells in the third program loop LP3, a current sensing check (CSC) operation and a second verify operation using a second verify voltage V2 may be performed from the fourth program loop LP4. For example, in the fourth program loop LP4, a current sensing check (CSC) operation for the first verify operation may be performed during a sub-program operation using a fourth program voltage 4Vpgm. After the sub-program operation has been performed, first to third verify operations using the first to third verify voltages V1 to V3 may be performed.

During the current sensing check (CSC) operation performed in the fourth program loop LP4, when the first verify operation of the third program loop LP3 is determined to have passed, the first verify operation may be skipped from a fifth program loop LP5.

Figure 16:
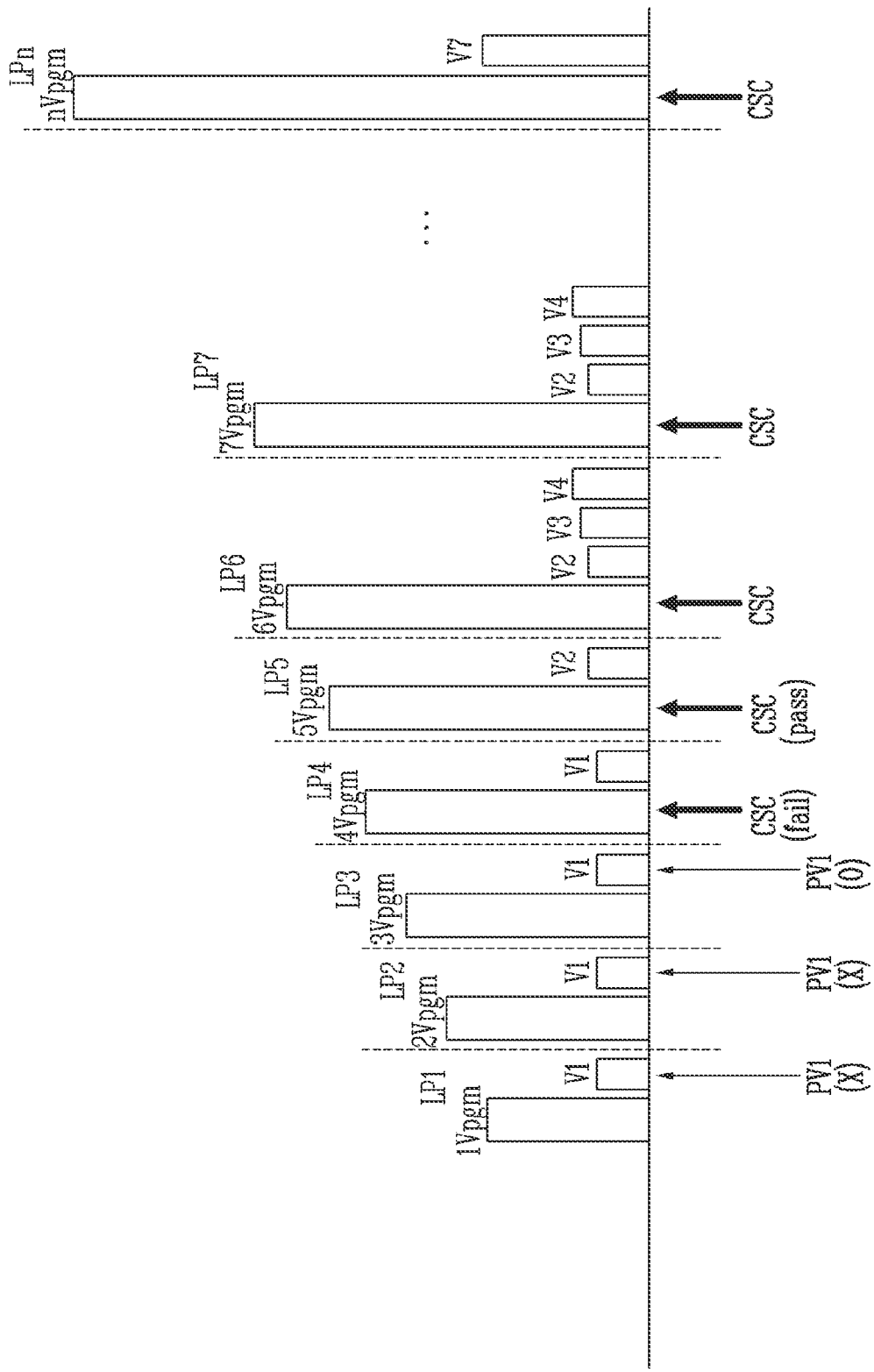
FIG. 16 is a diagram illustrating a program operation according to a third embodiment of the present disclosure.

FIG. 16 is a diagram illustrating a program operation according to a third embodiment of the present disclosure.

Referring to FIG. 16, in the third embodiment, verify operations using verify voltages higher than a first verify voltage V1 may be performed since a current sensing check (CSC) operation for the first verify operation has passed. For example, when the number of memory cells having passed the first verify operation is detected as being equal to or greater than the reference number of memory cells in a third program loop LP3, the current sensing check (CSC) operation may be performed from a fourth program loop LP4, When the CSC operation for the first verify operation performed in the fourth program loop LP4 has failed, a sub-program operation and a first verify operation may be performed in the fourth program loop LP4. When a CSC operation for a first verify operation performed in a fifth program loop LP5 has passed, a first verify operation may be skipped in the fifth program loop LP5. Also, a second verify operation using a second verify voltage V2 may be performed. Therefore, during a current check sensing (CSC) operation of a sixth program loop LP6, it may be determined whether the second verify operation has passed or failed.

Figure 17:
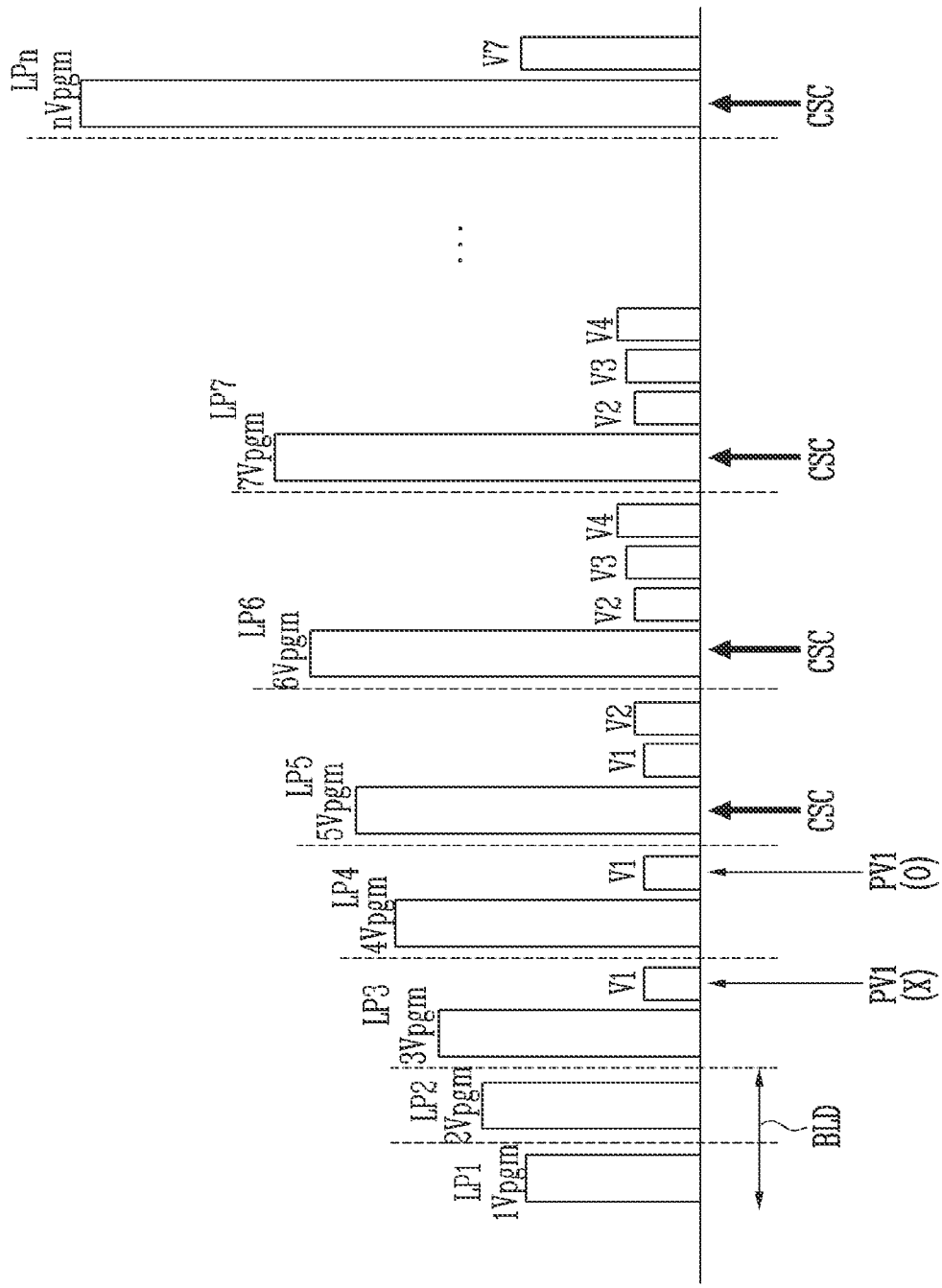
FIG. 17 is a diagram illustrating a program operation according to a fourth embodiment of the present disclosure.

FIG. 17 is a diagram illustrating a program operation according to a fourth embodiment of the present disclosure.

Referring to FIG. 17, in an initial stage of a program operation, it may be difficult for the threshold voltages of memory cells to sufficiently increase to target voltages. Thus, a verify operation may be skipped in some program loops performed in the initial stage of the program operation. For example, in first and second program loops LP1 and LP2, only sub-program operations may be performed without a verify operation being performed. In this way, an interval in which a verify operation is skipped and only a program voltage is applied to a selected word line is referred to as a blind interval (BLD). The blind interval BLD may be set differently depending on the program speed of memory cells. As illustrated in FIG. 17, when first and second program loops LP1 and LP2 are included in the blind interval BLD, a first verify operation using a first verify voltage V1 may be performed from a third program loop LP3. In the third program loop LP3, when the number of memory cells having passed the first verify operation is detected as being less than the reference number of memory cells (X), a current sensing check (CSC) operation may be skipped, even in a fourth program loop LP4.

When it is determined in the fourth program loop LP4 that the number of memory cells having passed the first verify operation is detected as being equal to or greater than the reference number of memory cells (O), a current sensing check (CSC) operation may be performed from a fifth program loop LP5. For example, in the fifth program loop LP5, a sub-program operation, which uses a fifth program voltage 5Vpgm and first and second verify operations, which use first and second verify voltages V1 and V2, may be performed. During the sub-program operation, a current sensing check (CSC) operation for the first verify operation performed in the fourth program loop LP4 may be performed.

Figure 18:
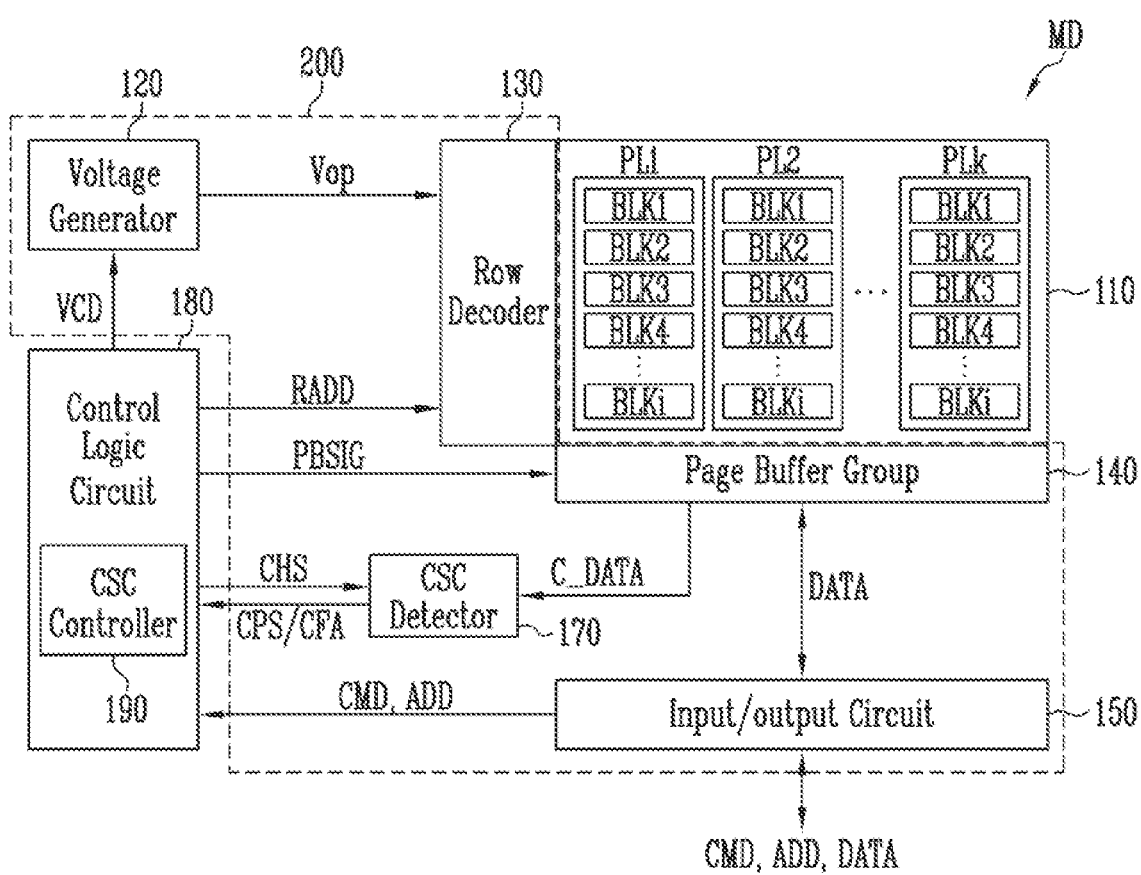
FIG. 18 is a block diagram illustrating a memory device according to an embodiment of the present disclosure.

FIG. 18 is a block diagram illustrating a memory device according to an embodiment of the present disclosure.

Referring to FIG. 18, in a memory device MD according to an embodiment of the present disclosure, components other than a current sensing check (CSC) detector 170 may be configured in the same manner as the memory device MD illustrated in FIG. 2, Therefore, in the description of the memory device MD of FIG. 18, a description of components identical to those of the memory device MD of FIG. 2 will be omitted here.

The current sensing check detector 170 illustrated in FIG. 18 may further perform a function of the verify detector 160 of FIG. 2 in addition to a current sensing check operation of determining whether a verify operation has passed or failed. For example, the current sensing check detector 170 may count the number of faded memory cells during a program operation, and may perform the current sensing check operation depending on the counted result.

The function of the current sensing check detector 170 will be described below. That is, the current sensing check detector 170 may receive check data C_DATA from the page buffer group 140 in response to a check enable signal CHS, may compare the number of failed bits included in the check data C_DATA with the reference number of failed bits, and may determine whether a current sensing check operation is to be performed based on the result of the comparison, Here, the check data C_DATA may be chunk data.

The current sensing check detector 170 may perform a current sensing check operation when the number of failed chunk bits is less than or equal to the reference number of failed chunk bits. The current sensing check detector 170 may skip a current sensing check operation in the current program loop when the number of failed chunk bits is greater than the reference number of failed chunk bits.

When it is determined that the current sensing check operation is to be performed, the current sensing check detector 170 may perform a current sensing check operation of determining whether the verify operation has passed or failed. For example, the current sensing check detector 170 may receive the check data C_DATA from the page buffer group 140 in response to a check enable signal CHS, and may compare the number of failed page bits included in the check data C_DATA with the allowable number of failed page bits. Then, the current sensing check detector 170 may output a check pass signal CPS or a check fail signal CFA based on the result of the comparison. For example, the current sensing check detector 170 may output the check pass signal CPS when the number of failed page bits is less than or equal to the allowable number of failed page bits, and may output the check fail signal CFA when the number of failed page bits is greater than the allowable number of failed page bits. When at least one plane, among the plurality of planes PL1 to PLk, has passed the verify operation, the current sensing check detector 170 may determine that the program operation has passed and output the check pass signal CPS even if verify operations on the remaining planes have failed. For example, the current sensing check detector 170 may output the check pass signal CPS when all of the planes PL1 to PLk have passed the verify operations, and may output the check pass signal CPS even if one of the planes PL1 to PLk has passed the verify operation.

Various embodiments of a program operation using the memory device MD illustrated in FIG. 18 will be described below.

Figure 19:
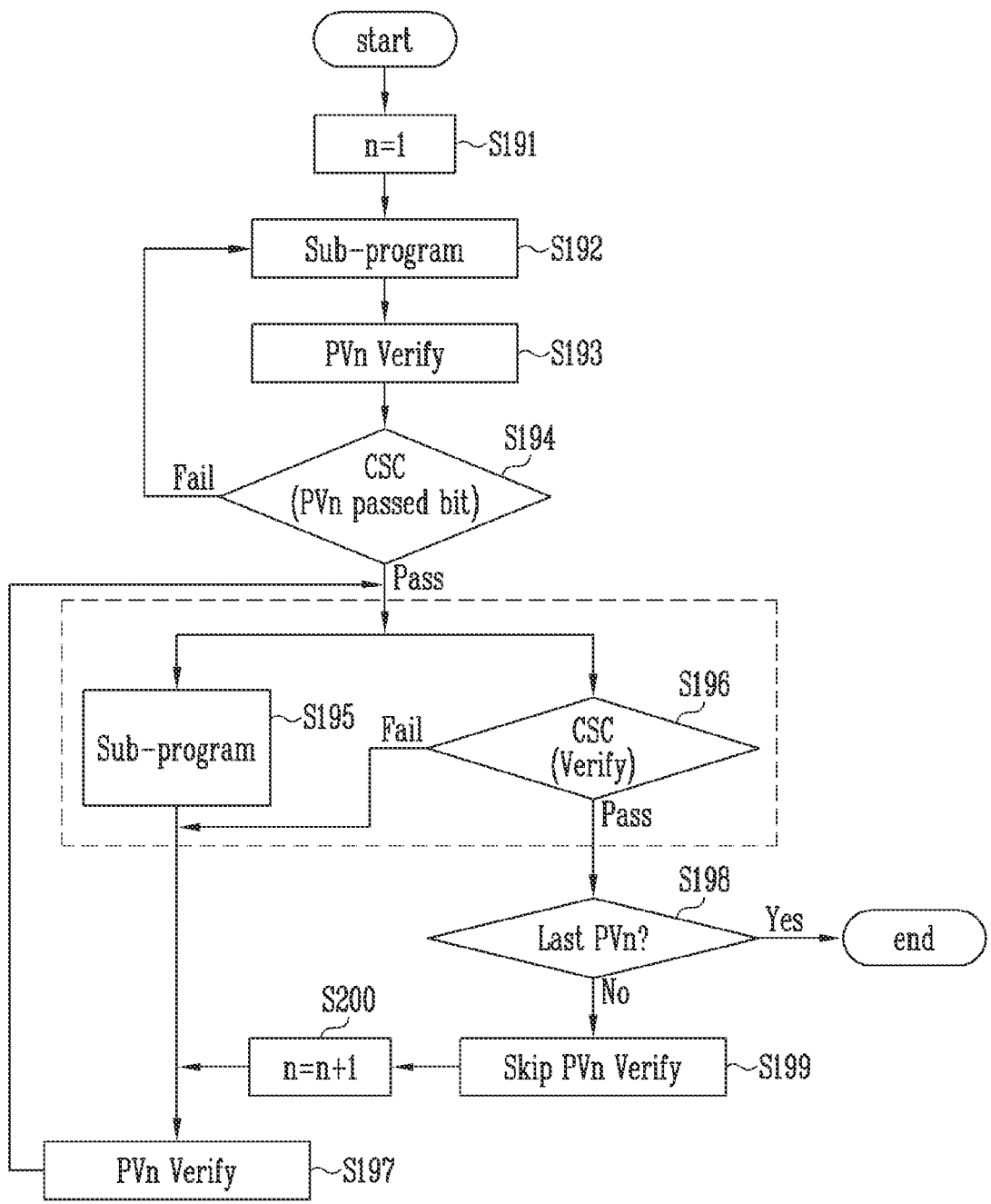
FIG. 19 is a flowchart illustrating a program operation according to an embodiment of the present disclosure.

FIG. 19 is a flowchart illustrating a program operation according to an embodiment of the present disclosure.

Referring to FIG. 19, during a program operation according to the present embodiment, a current sensing check operation of determining whether a verify operation has passed or failed may be skipped until the number of memory cells whose threshold voltages are lower than a target voltage, among selected memory cells having the lowest target voltage, becomes less than or equal to the preset number of memory cells. The current sensing check operation may be performed since the number of memory cells whose threshold voltages have F, increased up to the target voltage, among the memory cells having the lowest target voltage, has reached the preset number of memory cells. A program operation according to the present embodiment will be described in detail below.

The value n, which indicates the order of target voltages, may be set to 1 at step S191. For example, in a triple-level cell (TLC) scheme in which three bits of data are stored in one memory cell, there may be seven different target voltages for distinguishing program states. In a quadruple-level cell (QLC) scheme in which four bits of data are stored in one memory cell, there may be 15 different target voltages (see TLC or QLC of FIG. 5), In the TLC or QLC scheme, the lowest target voltage may be a first target voltage, and the program operation may start from the first target voltage, Therefore, at step S191, '1' may be set as an initial value for n. While the program operation is performed, n may change from 1 to 7 in the TLC scheme, and n may change from 1 to 15 in the QLC scheme.

A sub-program operation may be performed on selected memory cells at step S192. The sub-program operation may be an operation of applying a program voltage to a selected word line to increase the threshold voltages of the selected memory cells. When the sub-program operation is initially performed, a start program voltage may be applied to the selected word line. The start program voltage may be the lowest voltage, among program voltages applied to the selected word line.

After the program voltage has been applied for a predetermined period of time, a verify operation for an n-th target voltage PVn may be performed at step S193. The verify operation may be performed by applying an n-th verify voltage to the selected word line.

After the verify operation at step S193 has been performed for a predetermined period of time, an operation of determining whether bits of memory cells whose threshold voltages have increased up to the n-th target voltage, have been detected may be performed at step S194. For example, the current sensing check detector (e.g., 170 of FIG. 18) may count the number of bits of memory cells whose threshold voltages are lower than the n-th target voltage. Since n is 1, at step S194, memory cells, the threshold voltages of which have increased up to a first target voltage having a lowest level, among a plurality of target voltages, may be detected, and a pass or a fail may be determined by comparing the number of detected memory cells with the reference number of memory cells. For example, the current sensing check detector 170 may compare the number of failed chunk bits included in the check data C_DATA with the reference number of failed chunk bits, and may then determine a pass or a fail. When the number of failed chunk bits is greater than the reference number of failed chunk bits, a program voltage may be increased, and the sub-program operation S192 may be performed using the increased program voltage. That is, when step S194 fails, a next program loop may be performed. Steps S192 to S194 may be repeated while the program voltage is increased in steps until step S194 passes. Step S194 may pass when the number of faded chunk bits is less than or equal to the reference number of faded chunk bits.

When step S194 has passed, a next program loop may be performed, and then the current sensing check detector 170 may perform a current sensing check (CSC) operation at step S196. For example, the current sensing check operation S196 may be performed when the sub-program operation S195 is performed. The sub-program operation S195 and the current sensing check operation S196 will be described in detail below.

When step S194 has passed, the sub-program operation may be performed at step S195. The sub-program operation may be an operation of applying a program voltage to a selected word line to increase the threshold voltages of the selected memory cells, and may be performed in a manner similar to that of step S192. At step S195, a program voltage higher than that used at step S192 may be used.

The current sensing check operation S196 corresponding to a verify operation of a previous program loop may be performed while the sub-program operation S195 is performed. For example, when the number of error bits detected in the verify operation of the previous program loop is greater than the allowable number of error bits, the current sensing check operation S196 may fail. Otherwise, when the number of error bits is less than or equal to the allowable number of error bits, the current sensing check operation S196 may pass.

When the current sensing check (CSC) operation fans (in the case of Fail), a verify operation for the n-th target voltage PVn may be performed at step S197. The verify operation may be performed by applying the n-th verify voltage to the selected word line.

After the verify operation has been performed at step S197, the sub-program operation S195 and the current sensing check operation S196 corresponding to a next program loop may be performed. The sub-program operation S195 may be performed using a program voltage higher than that in the previous program loop, and the current sensing check operation S196 may determine whether the verify operation performed at step S197 has passed or failed.

When, in the current sensing check operation S196, the verify operation is determined to have passed (in the case of Pass), whether the n-th target voltage PVn is the last target voltage of the program operation may be determined at step S198. The last target voltage may be the highest target voltage in the program operation. For example, when a program operation in a TLC scheme is performed, each of the selected memory cells may be programmed to first to seventh target voltages. When a first target voltage PV1 is the lowest voltage and a seventh target voltage PV7 is the highest voltage, the seventh target voltage PV7 may be the last target voltage.

When the n-th target voltage PVn is the last target voltage (in the case of Yes), the program operation performed on the selected page may be terminated.

When the n-th target voltage PVn is not the last target voltage (in the case of No), a verify operation for the n-th target voltage PVn may be skipped at step S199, and a next target voltage may be selected at step S200. For example, n may be changed to n+1 at step S200, and the verify operation S197 for the changed n-th target voltage PVn may be performed.

Steps S195 to S200 may be repeated until all current sensing check operations for the target voltages ranging to the last target voltage pass at step S198.

Figure 20:
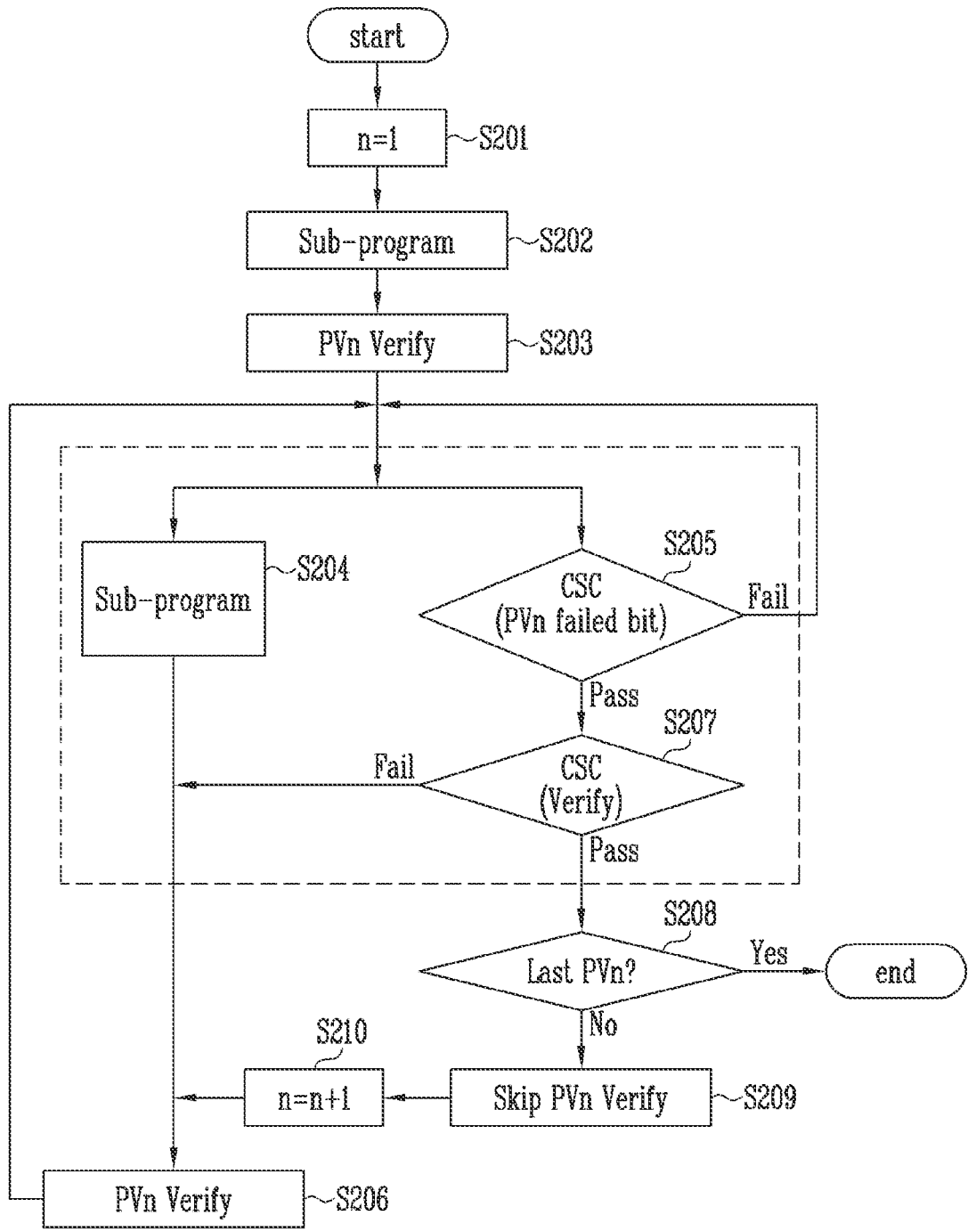
FIG. 20 is a flowchart illustrating a program operation according to an embodiment of the present disclosure.

FIG. 20 is a flowchart illustrating a program operation according to an embodiment of the present disclosure.

Referring to FIG. 20, during a program operation according to the present embodiment, an operation of determining the number of passed bits to determine a time point at which the current sensing check operation is to be started may be performed while a sub-program operation is performed. A program operation according to the present embodiment will be described in detail below.

The value n, which indicates the order of target voltages, may be set to 1 at step S201. For example, in a triple-level cell (TLC) scheme in which three bits of data are stored in one memory cell, there may be seven different target voltages for distinguishing program states. In a quadruple-level cell (QLC) scheme in which four bits of data are stored in one memory cell, there may be 15 different target voltages (see TLC or QLC of FIG. 5). In the TLC or QLC scheme, the lowest target voltage may be a first target voltage, and the program operation may start from the first target voltage. Therefore, at step S201, '1' may be set as an initial value for n. While the program operation is performed, n may change from 1 to 7 in the TLC scheme, and may change from 1 to 15 in the QLC scheme.

A sub-program operation may be performed on selected memory cells at step S202. The sub-program operation may be an operation of applying a program voltage to a selected word line to increase the threshold voltages of the selected memory cells. When the sub-program operation is initially performed, a start program voltage may be applied to the selected word line. Among program voltages applied to the selected word line, the start program voltage may be the lowest voltage.

After the program voltage has been applied for a predetermined period of time at step S202, a verify operation for an n-th target voltage PVn may be performed at step S203. The verify operation may be performed by applying an n-th verify voltage to the selected word line.

After the verify operation S203 has been performed, a next program operation may be performed. Then the operation S205 of determining the number of passed bits may be performed together with the sub-program operation S204, and the current sensing check (CSC) operation S207 may be selectively performed depending on the result of the determination at step S205. For example, the operation S205 of determining the number of failed bits and the current sensing check operation S207 may be performed when the sub-program operation is performed at step S204. The sub-program operation S204, the operation S205 of determining the number of failed bits, and the current sensing check operation S207 will be described in detail below.

The sub-program operation S204 may be an operation of applying a program voltage to a selected word line to increase the threshold voltages of the selected memory cells, and may be performed in a manner similar to that of step S202. At step S204, a program voltage higher than that used at step S202 may be used.

While the sub-program operation S204 is performed, the operation S205 of comparing the number of failed bits detected in the verify operation of a previous program loop with the reference number of failed bits may be performed. For example, in the operation S205 of comparing the number of failed bits with the reference number of failed bits, an operation of determining whether bits of memory cells having threshold voltages lower than the n-th target voltage are detected may be performed at step S205. Since n is 1, at step S205, the number of memory cells whose threshold voltages are lower than a first target voltage having the lowest level, among a plurality of target voltages, may be counted, and a pass or a fail may be determined by comparing the counted number with the reference number of memory cells. For example, the current sensing check detector 170 illustrated in FIG. 18 may compare the number of failed chunk bits included in chunk data with the reference number of failed chunk bits, and may then determine a pass or a fail. When the number of failed chunk bits is greater than the reference number of failed chunk bits, the program voltage may be increased. Then the sub-program operation S204 may be performed again using the increased program voltage. That is, when step S205 fails, the current sensing check operation S207 may be skipped, and a next program loop may be performed. Even if step S205 fails, the sub-program operation may be performed at step S204. Thus, the verify operation S206 for the sub-program operation may be performed. That is, when step S205 fails, the verify operation is performed at step S206, after which the sub-program operation S204 may be performed again.

Steps S204 to S206 may be repeated while the program voltage is increased in steps until step S205 passes.

At step S205, when it is determined that the number of failed chunk bits is less than or equal to the reference number of failed chunk bits (in the case of Pass), the current sensing check operation S207 may be performed. For example, when the number of error bits detected in the verify operation of the previous program loop is greater than the allowable number of error bits, the current sensing check operation S207 may fail. However, when the number of error bits is less than the allowable number of error bits, the current sensing check operation S207 may pass.

When the current sensing check (CSC) operation fans (in the case of Fail), a verify operation for the n-th target voltage PVn may be performed at step S206. The verify operation may be performed by applying an n-th verify voltage to the selected word line.

After the verify operation has been performed at step S206, the sub-program operation S204, the operation S205 of determining the number of failed bits, and the current sensing check operation S207, which correspond to a next program loop, may be performed. The sub-program operation S204 may be performed using a program voltage higher than that in a previous program loop. Step S205 of determining the number of passed bits indicates that the corresponding operation has already passed at a previous step, and thus the passed state may be continuously maintained while subsequent operations are performed.

The current sensing check operation S207 may determine whether the verify operation performed at step S206 in a previous loop has passed or failed.

When, in the current sensing check operation S207, the verify operation is determined to have passed (in the case of Pass), it may be determined at step S208 whether the n-th target voltage PVn is the last target voltage of the program operation. The last target voltage may be the highest target voltage in the program operation. For example, when a program operation in a TLC scheme is performed, each of the selected memory cells may be programmed to first to seventh target voltages. When a first target voltage PV1 is the lowest voltage and a seventh target voltage PV7 is the highest voltage, the seventh target voltage PV7 may be the last target voltage.

When the n-th target voltage PVn is the last target voltage (in the case of Yes), the program operation performed on the selected page may be terminated. When the n-th target voltage PVn is not the last target voltage (in the case of No), a verify operation for the n-th target voltage PVn may be skipped at step S209, and a next target voltage may be selected at step S210. For example, n may be changed to n+1 at step S210, and the verify operation S206 for the changed n-th target voltage PVn may be performed.

Steps S204 to S210 may be repeated until all current sensing check operations for the target voltages ranging to the last target voltage pass at step S208.

Figure 21:
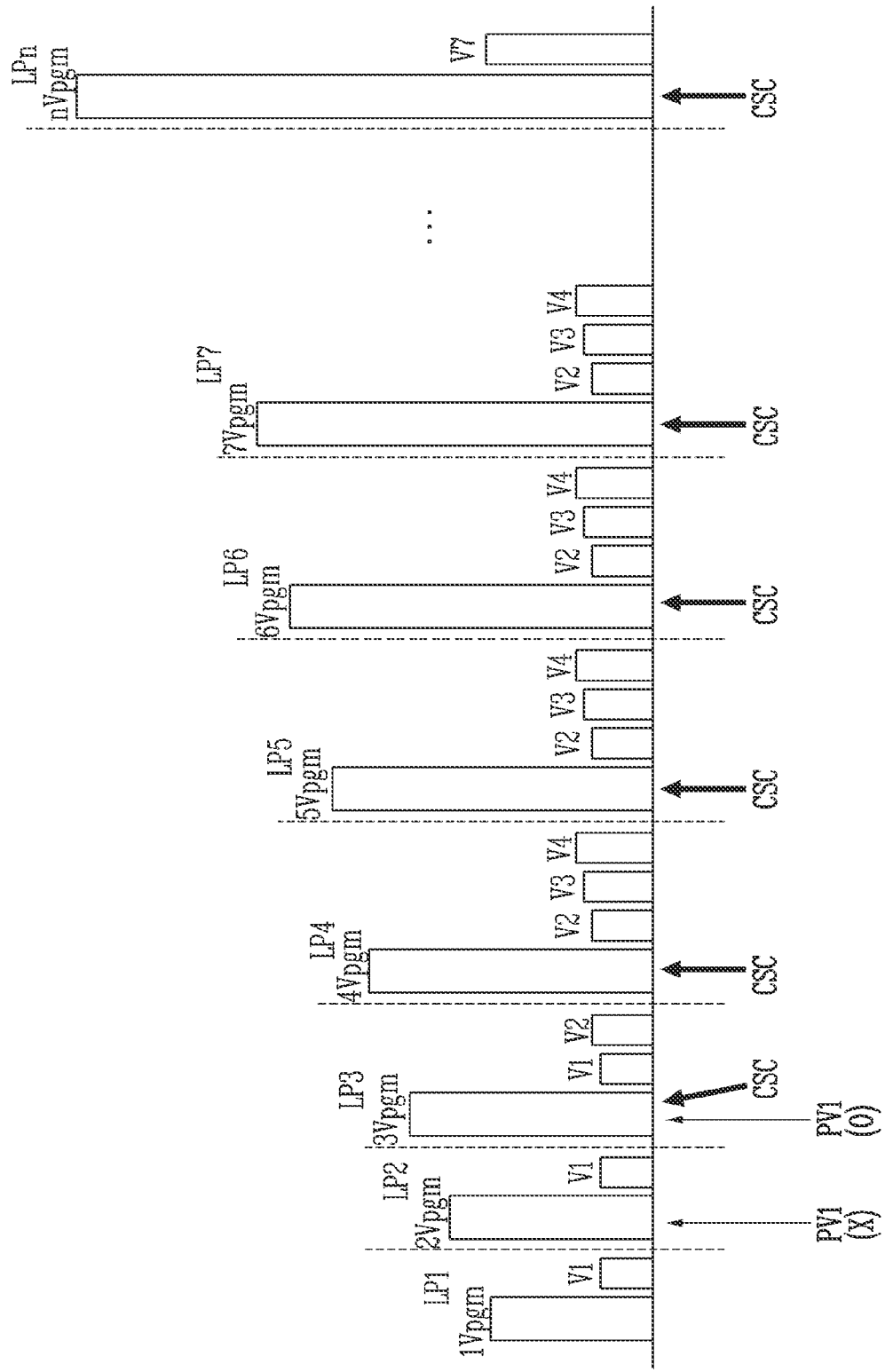
FIG. 21 is a diagram illustrating a program operation according to a fifth embodiment of the present disclosure.

FIG. 21 is a diagram illustrating a program operation according to a fifth embodiment of the present disclosure.

Referring to FIG. 21, in a first program loop LPL a sub-program operation using a first program voltage 1Vpgm and a first verify operation using a first verify voltage V1 may be performed. The first verify operation may include an operation of sensing the threshold voltages of selected memory cells using a first verify voltage V1.

In a second program loop LP2, a sub-program operation, which uses a second program voltage 2Vpgm higher than the first program voltage 1Vpgm by a step voltage, and a first verify operation, which uses the first verify voltage V1, may be performed.

From the second program loop LP2, an operation PV1 of determining whether the number of memory cells whose threshold voltages have increased up to the first verify voltage V1, has been detected as being equal to or greater than the reference number of memory cells may be performed. For example, while the sub-program operation of the second program loop LP2 is performed, the operation PV1 of determining whether the number of memory cells, threshold voltages of which are lower than the first verify voltage V1, has been detected as being less than or equal to the reference number of memory cells may be performed. When it is determined that the number of memory cells whose threshold voltages are lower than the first verify voltage V1, is greater than the reference number of memory cells (X), the remaining operations of the second program loop LP2 may be performed without a current sensing check (CSC) operation being performed. For example, after the sub-program operation has been performed, the first verify operation using the first verify voltage V1 may be performed.

In the third program loop LP3, a sub-program operation, which uses a third program voltage 3Vpgm higher than the second program voltage 2Vpgm by a step voltage, and first and second verify operations, which use first and second verify voltages V1 and V2, may be performed. While the sub-program operation of the third program loop LP3 is performed, an operation PV1 of determining whether the number of memory cells whose threshold voltages are lower than the first verify voltage V1, has been detected as being less than or equal to the reference number of memory cells may be performed. When it is determined that the number of memory cells whose threshold voltages are lower than the first verify voltage V1, is greater than the reference number of memory cells (O), a current sensing check (CSC) operation may be performed from the third program loop LP3. For example, during the operation PV1 of determining whether the number of memory cells whose threshold voltages are lower than the first verify voltage V1, has been detected as being less than or equal to the reference number of memory cells, the number of faded bits in the corresponding chunk may be counted. Further, in the current sensing check (CSC) operation, whether a verify operation has passed or faded may be determined on a plane basis.

That is, the current sensing check (CSC) operation performed in the third program loop LP3 may be an operation of determining whether the first verify operation of the second program loop LP2 has passed or failed. When it is determined that the first verify operation of the second program loop LP2 has passed in the current sensing check (CSC) operation, the first verify operation may be skipped from a fourth program loop LP4.

In the above-described manner, the remaining program loops, that is, fourth to n-th program loops LP4 to LPn, may be performed. Then, the program operation on the selected page may be terminated when a seventh verify operation performed in the n-th program loop has passed.

Figure 22:
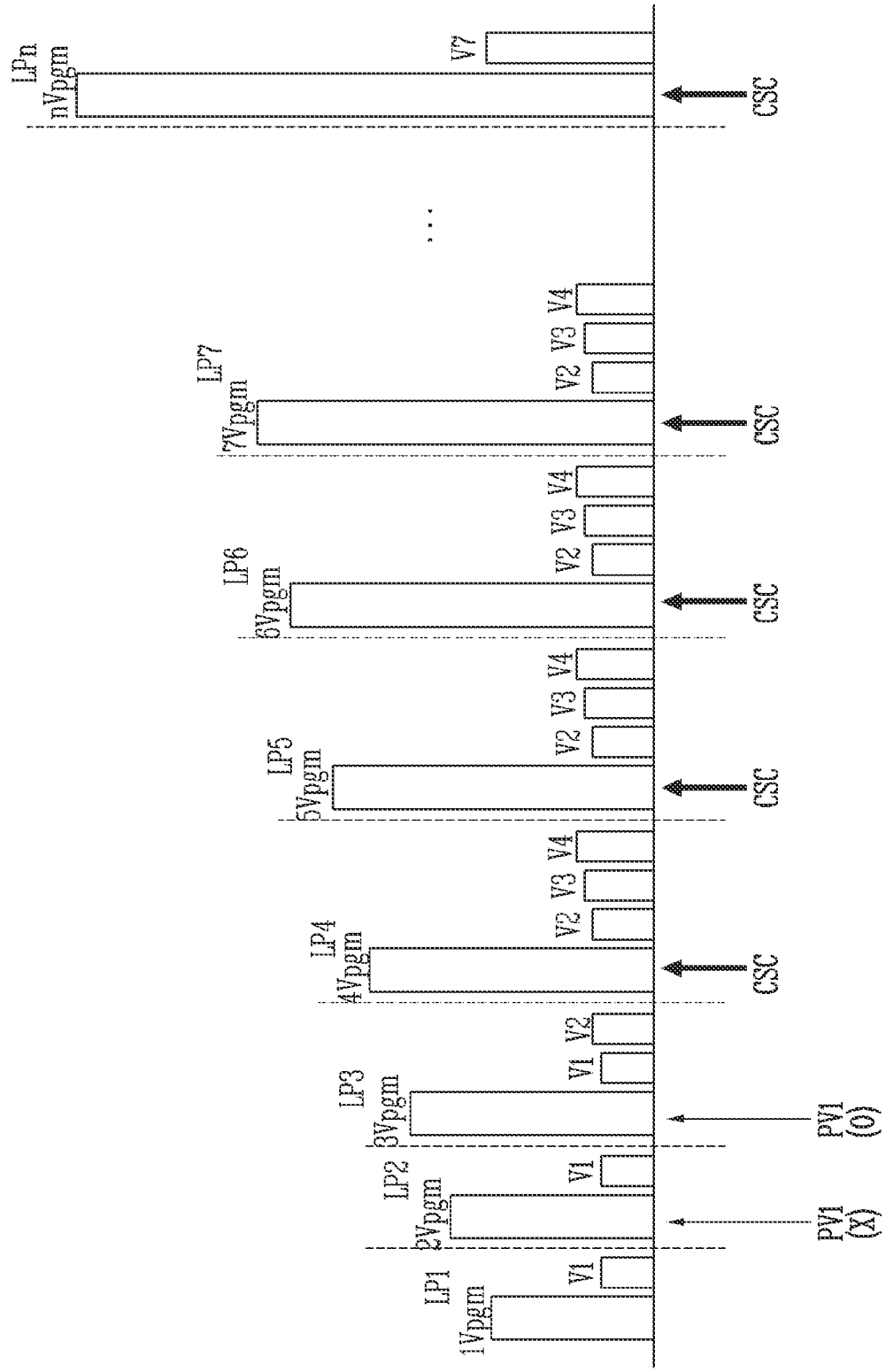
FIG. 22 is a diagram illustrating a program operation according to a sixth embodiment of the present disclosure.

FIG. 22 is a diagram illustrating a program operation according to a sixth embodiment of the present disclosure.

Referring to FIG. 22, in a first program loop LP1, a sub-program operation using a first program voltage 1Vpgm and a first verify operation using a first verify voltage V1 may be performed. The first verify operation may include an operation of sensing the threshold voltages of selected memory cells using a first verify voltage V1.

In a second program loop LP2, a sub-program operation, which uses a second program voltage 2Vpgm higher than the first program voltage 1Vpgm by a step voltage, and a first verify operation, which uses the first verify voltage V1, may be performed.

From the second program loop LP2, an operation PV1 of determining whether the number of memory cells whose threshold voltages have increased up to the first verify voltage V1, has been detected as being equal to or greater than the reference number of memory cells may be performed. For example, while the sub-program operation of the second program loop LP2 is performed, the operation PV1 of determining whether the number of memory cells, whose threshold voltages are lower than the first verify voltage V1, has been detected as being less than or equal to the reference number of memory cells may be performed. When it is determined that the number of memory cells whose threshold voltages are lower than the first verify voltage V1, is greater than the reference number of memory cells (X), the remaining operations of the second program loop LP2 may be performed without a current sensing check (CSC) operation being performed. For example, after the sub-program operation has been performed, the first verify operation using the first verify voltage V1 may be performed.

In a third program loop LP3, a sub-program operation, which uses a third program voltage 3Vpgm higher than the second program voltage 2Vpgm by a step voltage, and the first and second verify operations, which use the first and second verify voltages V1 and V2, may be performed. While the sub-program operation of the third program loop LP3 is performed, an operation PV1 of determining whether the number of memory cells, whose threshold voltages are lower than the first verify voltage V1, is greater than the reference number of memory cells may be performed. When it is determined that the number of memory cells whose threshold voltages are lower than the first verify voltage V1, is less than or equal to the reference number of memory cells (O), the first verify operation may be performed only to the third program loop LP3. Then a first verify operation using the first verify voltage V1 may be skipped from the fourth program loop LP4.

When it is determined in the third program loop LP3 that the number of memory cells whose threshold voltages are lower than the first verify voltage V1, is less than or equal to the reference number of memory cells (O), a current sensing check (CSC) operation may be performed from the fourth program loop LP4.

In the above-described manner, the remaining program loops, that is, fourth to n-th program loops LP4 to LPn may be performed, and the program operation on the selected page may be terminated when a seventh verify operation performed in the n-th program loop has passed.

Figure 23:
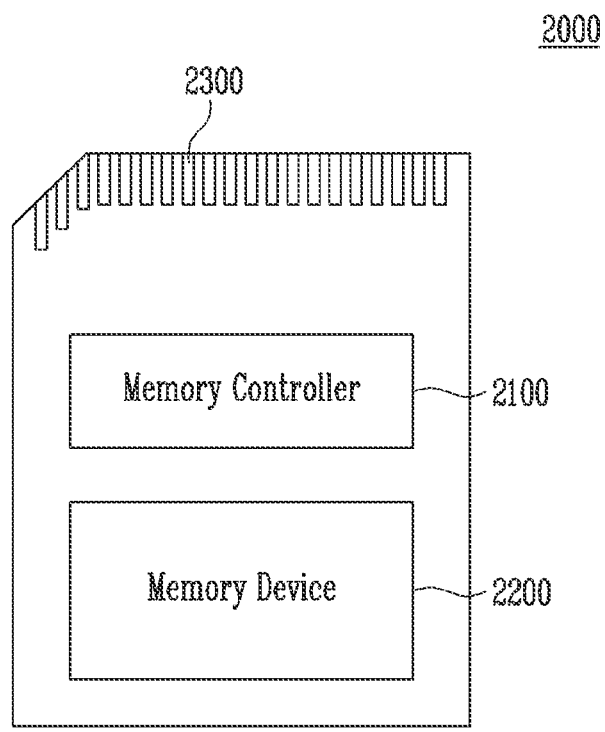
FIG. 23 is a block diagram illustrating a memory card system to which a memory device according to an embodiment of the present disclosure is applied.

FIG. 23 is a block diagram illustrating a memory card system to which a memory device according to an embodiment of the present disclosure is applied.

Referring to FIG. 23, a memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may control a program, a read, or an erase operation of the memory device 2200, or may control a background operation of the memory device 2200. The memory controller 2100 may provide an interface between the memory device 2200 and a host. The memory controller 2100 may run firmware for controlling the memory device 2200. The memory device 2200 may be operated in the same manner as the memory device MD, described above with reference to FIG. 2 or 18.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various interface protocols such as a universal serial bus (USB), a multimedia card (MMC), embedded MMC (eMMC), a peripheral component interconnection (PCI), PCI-express (PCI-E), an advanced technology attachment (ATA) protocol, a serial-ATA (SATA), parallel-ATA (PATH), a small computer system interface (SCSI), enhanced small disk interface (ESDI), integrated drive electronics (IDE), firewire, universal flash storage (UFS), WIFI, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-transfer torque magnetic RAM (STT-MRAM).

The memory controller 2100 and the memory device 2200 may be integrated into a single semiconductor device to form a memory card. For example, the memory controller 2100 and the memory device 2200 may be integrated into a single semiconductor device to form a memory card such as a personal computer memory card international association (PCMCIA), a compact flash card (CF), a smart media card (SM or SMC), a memory stick a multimedia card (MMC, RS-MMC, MMCmicro or eMMC), a SD card (SD, miniSD, microSD, or SDHC), a universal flash storage (UFS), or the like.

Figure 24:
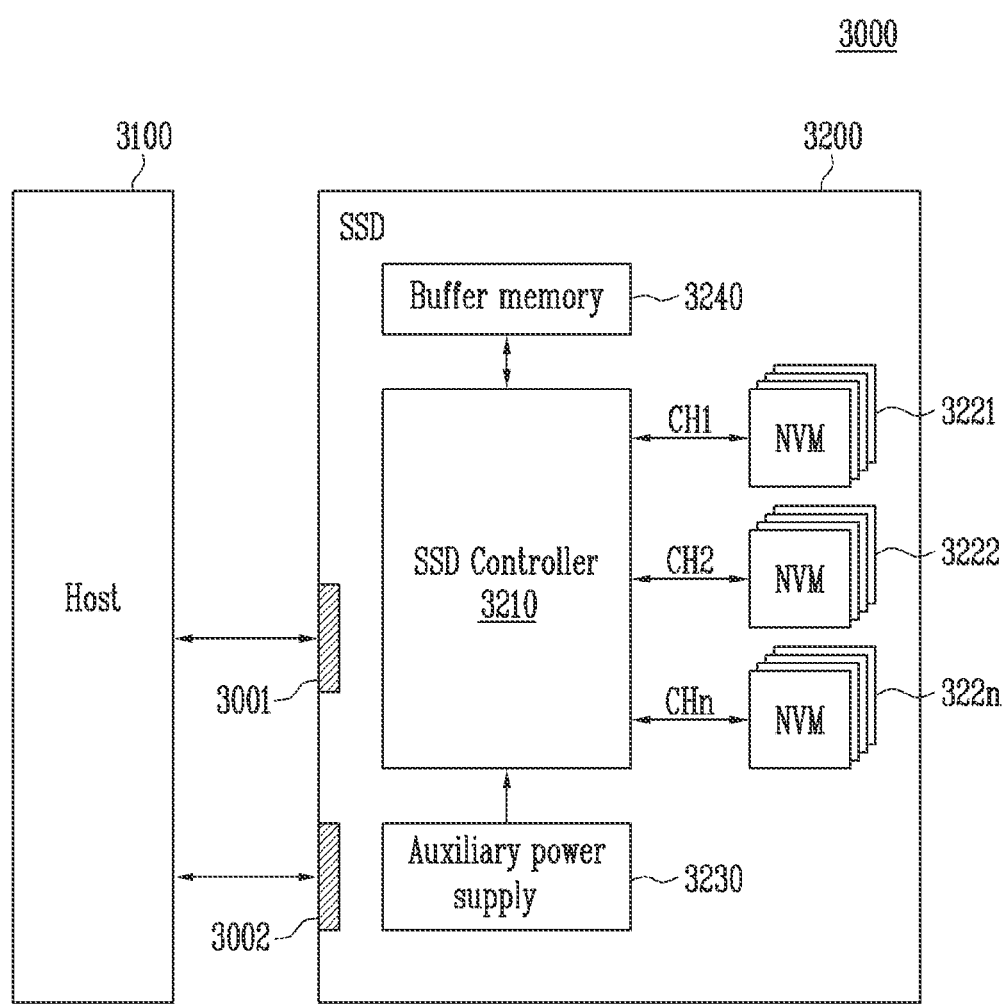
FIG. 24 is a block diagram illustrating a solid state drive (SSD) system to which a memory device according to the present disclosure is applied.

FIG. 24 is a block diagram illustrating a solid state drive (SSD) system to which a memory device according to the present disclosure is applied.

Referring to FIG. 24, an SSD system 3000 includes a host F, 3100 and an SSD 3200. The SSD 3200 may exchange a signal with the host 3100 through a signal connector 3001, and may receive a power voltage through a power connector 3002. The SSD 3200 may include an SSD controller 3210, a plurality of flash memories 3221 to 322n, an auxiliary power supply 3230, and a buffer memory 3240.

In accordance with an embodiment of the present disclosure, the flash memories 3221 to 322n may be configured in the same manner as the memory device MD, described above with reference to FIG. 2 or 18.

The SSD controller 3210 may control the plurality of flash memories 3221 to 322n in response to signals received from the host 3100. In an embodiment, the signals may be signals based on the interfaces of the host 3100 and the SSD 3200. For example, such a signal may be a signal defined by at least one of various interfaces such as a universal serial bus (USB), a multimedia card (MMC), embedded MMC (eMMC), a peripheral component interconnection (PCI), PCI-express (PCI-E), an advanced technology attachment (ATA), serial-ATA (SATA), parallel-ATA (PATA), a small computer system interface (SCSI), enhanced small disk interface (ESDI), integrated drive electronics (IDE), firewire, universal flash storage (UFS), WiFi, Bluetooth, and nonvolatile memory express (NVMe) interfaces.

The auxiliary power supply 3230 may be coupled to the host 3100 through the power connector 3002. The auxiliary power supply 3230 may be supplied with power from the host 3100, and may be charged. The auxiliary power supply 3230 may supply the power of the SSD 3200 when the supply of power from the host 3100 is not smoothly performed. In an embodiment, the auxiliary power supply 3230 may be located inside the SSD 3200 or located outside the SSD 3200. For example, the auxiliary power supply 3230 may be located in a main board, and may also provide auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n, or may temporarily store metadata (e.g., mapping tables) of the flash memories 3221 to 322n. The buffer memory 3240 may include volatile memories, such as a DRAM, an SDRAM, a DDR SDRAM, and an LPDDR SDRAM or nonvolatile memories, such as an FRAM, a ReRAM, an S H-MRAM, and a PRAM.

The present disclosure may shorten the time required for a program operation of a memory device.

What is claimed is:

1. A memory device, comprising:
   a plurality of pages, each including a plurality of memory cells;
   a peripheral circuit configured to perform a plurality of program loops and program a page selected from among the plurality of pages, wherein the peripheral circuit counts a number of memory cells whose threshold voltages have increased up to a first target voltage, among a part of memory cells included in the selected page, and performs a current sensing check operation of determining whether a verify operation performed in a previous program loop has passed or failed; and
   a control logic circuit configured to control the peripheral circuit to:
      delay performing the current sensing check operation when the number of memory cells whose threshold voltages have increased up to the first target voltage, is less than a reference number of memory cells, and
      perform the current sensing check operation when the number of memory cells whose threshold voltages have increased up to the first target voltage, is equal to or greater than the reference number of memory cells.

2. The memory device according to claim 1, wherein the peripheral circuit comprises:
   a verify detector configured to compare the number of memory cells whose threshold voltages have increased up to the first target voltage, with the reference number of memory cells and to output a check start signal or a check delay signal based on a result of the comparison; and
   a current sensing check detector configured to delay the current sensing check operation of determining whether the verify operation performed in the previous program loop has passed or failed until a check enable signal is output from the control logic circuit and to perform the current sensing check operation when the check enable signal is output.

3. The memory device according to claim 2, wherein the verify detector comprises:
a first bit counter configured to verify the memory cells in the selected page on a chunk basis, count the number of memory cells whose threshold voltages have increased up to the first target voltage, and output a number of passed chunk bits that are counted; and
a first comparator configured to compare the number of passed chunk bits with a reference number of passed chunk bits, output the check start signal when the number of passed chunk bits is equal to or greater than the reference number of passed chunk bits, and output the check delay signal when the number of passed chunk bits is less than the reference number of passed chunk bits.

4. The memory device according to claim 3, wherein:
the first bit counter is configured to receive verify data from one chunk selected from among a plurality of chunks included in the selected page and output the number of passed chunk bits included in the verify data, and
the first comparator is configured to output the check start signal when the number of passed chunk bits is equal to or greater than the reference number of passed chunk bits, and output the check delay signal when the number of passed chunk bits is less than the reference number of passed chunk bits.

5. The memory device according to claim 3, wherein:
the first bit counter is configured to sequentially receive pieces of verify data from a plurality of chunks included in the selected page and sequentially output numbers of passed chunk bits included in the pieces of verify data, and
the first comparator is configured to compare the numbers of passed chunk bits that are sequentially received with the reference number of passed chunk bits, and output the check start signal or the check delay signal based on a result of the comparison.

6. The memory device according to claim 5, wherein the first comparator is configured to:
compare the numbers of passed chunk bits respectively corresponding to the plurality of chunks with the reference number of passed chunk bits, and then output the check start signal or the check delay signal, and
when each of the numbers of passed chunk bits is equal to or greater than the reference number of passed chunk bits, output the check start signal, and thereafter stop an operation of comparing the numbers of passed chunk bits with the reference number of passed chunk bits.

7. The memory device according to claim 5, wherein the first comparator is configured to compare a value obtained by summing the numbers of passed chunk bits of the plurality of chunks with the reference number of passed chunk bits and then output the check start signal or the check delay signal.

8. The memory device according to claim 2, wherein the current sensing check detector comprises:
a second bit counter configured to receive data sensed from the selected page in response to the check enable signal, count a number of failed bits included in the sensed data, and output a number of failed page bits; and a second comparator configured to compare the number of failed page bits with an allowable number of failed page bits and output a check pass signal or a check fail signal based on a result of the comparison.

9. The memory device according to claim 8, wherein the second comparator is configured to:
output the check pass signal when the number of failed page bits is less than or equal to the allowable number of failed page bits, and
output the check fail signal when the number of failed page bits is greater than the allowable number of failed page bits.

10. The memory device according to claim 8, wherein, when the selected page is included in each of a plurality of planes, the second comparator is configured to:
output the check pass signal when the number of failed page bits of the selected page is less than or equal to the allowable number of failed page bits in all of the planes, and
output the check fail signal when, in at least one of the planes, the number of failed page bits of the selected page is greater than the allowable number of failed page bits.

11. The memory device according to claim 1, wherein the control logic circuit comprises:
a current sensing check controller configured to selectively output a check enable signal for performing the current sensing check operation depending on the number of memory cells whose threshold voltages are lower than the first target voltage, and to control a program loop of the selected page depending on a result of the verify operation or the current sensing check operation on the selected page.

12. The memory device according to claim 11, wherein the current sensing check controller comprises:
a program loop controller configured to output a verify signal or the check enable signal depending on the result of the verify operation or the current sensing check operation of each program loop performed on the selected page; and
a detector configured to output a pass signal when the number of memory cells whose threshold voltages are lower than the first target voltage is less than or equal to the reference number of memory cells or when the verify operation has passed, and to output a fail signal when the number of memory cells whose threshold voltages are lower than the first target voltage is greater than the reference number of memory cells or when the verify operation has failed.

13. The memory device according to claim 1, wherein the peripheral circuit comprises a current sensing check detector configured to:
compare the number of memory cells whose threshold voltages have increased up to the first target voltage, with the reference number of memory cells and output a check start signal or a check delay signal based on a result of the comparison, or
delay the current sensing check operation of determining whether the verify operation performed in the previous program loop has passed or failed until a check enable signal is output from the control logic circuit, and perform the current sensing check operation when the check enable signal is output.

14. A method of operating a memory device, comprising:
performing a sub-program operation of applying a program voltage to a plurality of memory cells included in a selected page;

performing a verify operation to verify threshold voltages of selected memory cells having a lowest target voltage, selected from among the plurality of memory cells; and comparing a number of passed bits detected in the verify operation with a reference number of passed bits, skipping a current sensing check operation of determining whether the verify operation has passed or failed in a next program loop when the number of passed bits is less than the reference number of passed bits; and performing the current sensing check operation from the next program loop when the number of passed bits is equal to or greater than the reference number of passed bits.

15. The method according to claim 14, wherein the number of passed bits is a number of memory cells whose threshold voltages have increased up to the target voltage, among the selected memory cells having the lowest target voltage.

16. The method according to claim 14, wherein, when the number of passed bits is less than the reference number of passed bits, the next program loop is performed using a program voltage higher than the program voltage.

17. The method according to claim 14, wherein comparing the number of passed bits detected in the verify operation with the reference number of passed bits is performed either before the next program loop is performed or during a sub-program operation of the next program loop.

18. The method according to claim 14, wherein, when the current sensing check operation is performed, the current sensing check operation is performed during the sub-program operation.

19. The method according to claim 14, wherein, when the current sensing check operation is performed, comparing the number of passed bits detected in the verify operation with the reference number of passed bits is skipped.

20. A method of operating a memory device, comprising:
performing a plurality of program loops for increasing threshold voltages of memory cells in a selected page,
wherein, in each of the plurality of program loops,
when a number of memory cells whose threshold voltages have increased up to a target voltage, is less than a reference number of memory cells, a current sensing check operation of determining a result of a verify operation of a previous program loop is skipped, and
when the number of memory cells whose threshold voltages have increased up to the target voltage, is equal to or greater than the reference number of memory cells, the current sensing check operation is performed.

21. The method according to claim 20, wherein, when the number of memory cells whose threshold voltages have increased up to the target voltage, is less than the reference number of memory cells, the corresponding program loop comprises:
applying a program voltage to a word line coupled to the selected page to increase the threshold voltages of the memory cells; and
comparing the number of memory cells whose threshold voltages have increased up to the target voltage, with the reference number of memory cells.

22. The method according to claim 20, wherein, when the number of memory cells whose threshold voltages have increased up to the target voltage, is equal to or greater than the reference number of memory cells, the corresponding program loop comprises:
applying a program voltage to a word line coupled to the selected page to increase the threshold voltages of the memory cells and performing the current sensing check operation; and
performing a verify operation of sensing whether the threshold voltages of all of the memory cells have increased up to the target voltage.

* * * * *